(12) United States Patent
Kaneyama et al.

(10) Patent No.: US 7,497,633 B2
(45) Date of Patent: Mar. 3, 2009

(54) SUBSTRATE PROCESSING APPARATUS AND SUBSTRATE PROCESSING METHOD

(75) Inventors: Koji Kaneyama, Kyoto (JP); Shuji Shibata, Kyoto (JP); Tsuyoshi Okumura, Kyoto (JP); Shuichi Yasuda, Kyoto (JP); Masashi Kanaoka, Kyoto (JP); Tadashi Miyagi, Kyoto (JP); Kazuhito Shigemori, Kyoto (JP)

(73) Assignee: Sokudo Co., Ltd., Kyoto (JP)

( * ) Notice: Subject to any disclaimer, the term of this patent is extended or adjusted under 35 U.S.C. 154(b) by 650 days.

(21) Appl. No.: 11/273,440

(22) Filed: Nov. 10, 2005

(65) Prior Publication Data

US 2006/0108068 A1 May 25, 2006

(30) Foreign Application Priority Data

Nov. 10, 2004 (JP) ............................. 2004-326308
Mar. 29, 2005 (JP) ............................. 2005-095786
Jul. 26, 2005 (JP) ............................. 2005-216160

(51) Int. Cl.
*G03D 5/00* (2006.01)
*G03B 27/52* (2006.01)
*C23C 14/00* (2006.01)
*B05C 11/00* (2006.01)

(52) U.S. Cl. ........................... 396/611; 118/50; 118/58; 414/935; 355/27

(58) Field of Classification Search ................. 396/611; 118/50, 52, 58, 696; 414/935; 355/27, 30
See application file for complete search history.

(56) References Cited

U.S. PATENT DOCUMENTS 6,824,616 B2 11/2004 Kitano et al.
6,893,171 B2 5/2005 Fukutomi et al.
2002/0150691 A1 10/2002 Kitano et al.
2003/0213431 A1* 11/2003 Fukutomi et al. ............ 118/696
2004/0182318 A1* 9/2004 Hashinoki et al. ........... 118/719
2005/0027387 A1* 2/2005 Fujishima ..................... 700/112
2005/0100679 A1 5/2005 Kitano et al.
2007/0122551 A1* 5/2007 Yamamoto et al. ........... 427/240
2007/0177869 A1* 8/2007 Yamamoto et al. ........... 396/611

FOREIGN PATENT DOCUMENTS

| JP | 2003-324139 | 11/2003 |
|---|---|---|
| JP | 2005-197469 | 7/2005 |
| JP | 2005-294520 | 10/2005 |
| KR | 2002-0081117 | 10/2002 |
| WO | WO/99-49504 | 9/1999 |

OTHER PUBLICATIONS

Office Action dated Oct. 27, 2006 in the counterpart Korean application (2005-0106058) and English Language translation.

\* cited by examiner

*Primary Examiner*—Alan A Mathews
(74) *Attorney, Agent, or Firm*—Townsend and Townsend and Crew LLP

(57) ABSTRACT

A substrate processing apparatus comprises an indexer block, an anti-reflection film processing block, a resist film processing block, a drying/development processing block, and an interface block. An exposure device is arranged adjacent to the interface block. The drying/development processing block comprises a drying processing group. The interface block comprises an interface transport mechanism. A substrate is subjected to exposure processing by the exposure device, and subsequently transported to the drying processing group by the interface transport mechanism. The substrate is cleaned and dried by the drying processing group.

28 Claims, 14 Drawing Sheets

F I G. 6
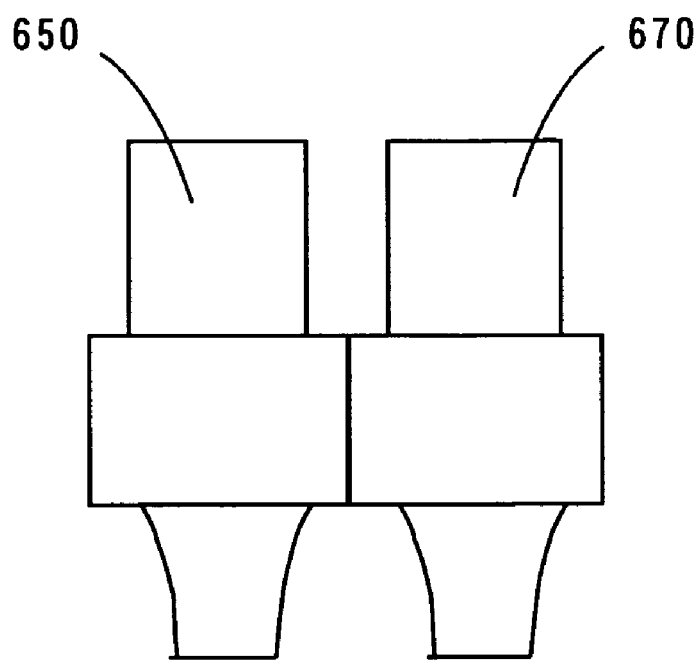

F I G. 9
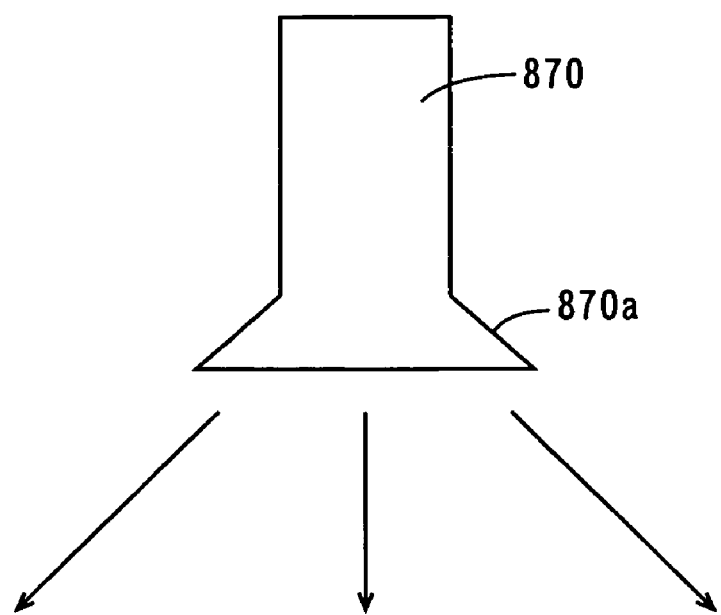

F I G. 1 3
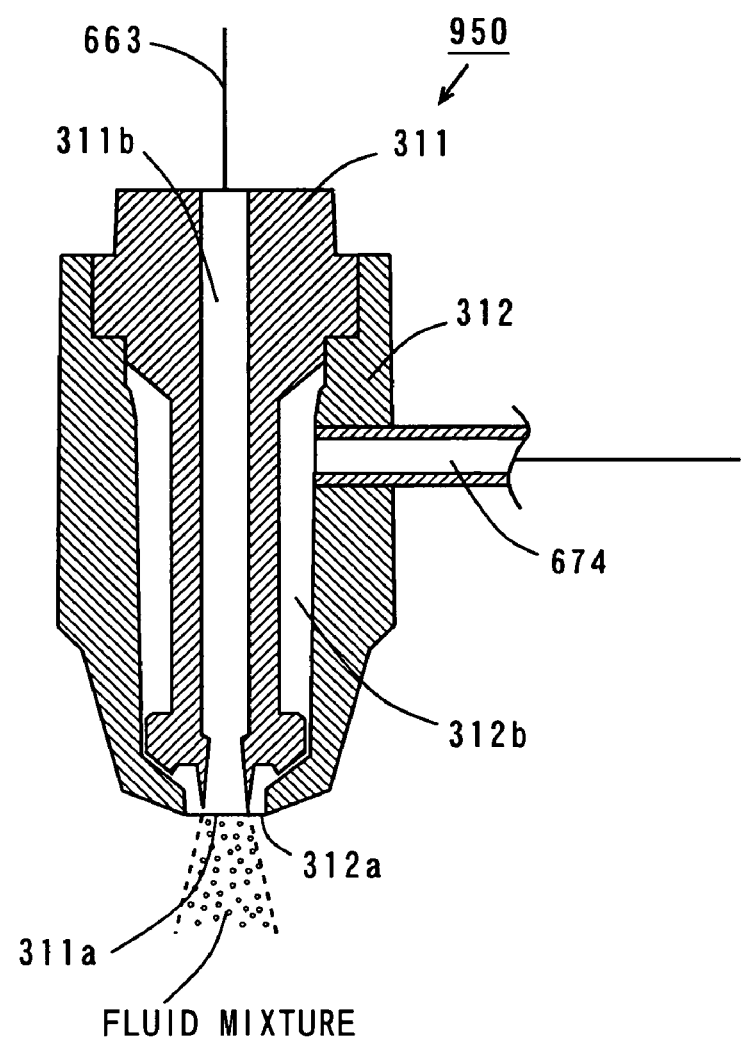

SUBSTRATE PROCESSING APPARATUS AND SUBSTRATE PROCESSING METHOD

CROSS REFERENCE TO A RELATED APPLICATION

The present application is related to the following four applications filed Nov. 10, 2005, and commonly owned: 1) SUBSTRATE PROCESSING APPARATUS AND SUBSTRATE PROCESSING METHOD, U.S. application Ser. No. 11/273,463; 2) SUBSTRATE PROCESSING APPARATUS AND SUBSTRATE PROCESSING METHOD, U.S. application Ser. No. 11/273,465; 3) SUBSTRATE PROCESSING APPARATUS AND SUBSTRATE PROCESSING METHOD, U.S. application Ser. No. 11/273,441; 4) SUBSTRATE PROCESSING APPARATUS AND SUBSTRATE PROCESSING METHOD, U.S. application Ser. No. 11/273,439.

BACKGROUND OF THE INVENTION

1. Field of the Invention

The present invention relates to substrate processing apparatuses and substrate processing methods for applying processing to substrates.

2. Description of the Background Art

A substrate processing apparatus is used to apply a variety of processings to substrates such as semiconductor substrates, substrates for use in liquid crystal displays, plasma displays, optical disks, magnetic disks, magneto-optical disks, photomasks, and other substrates.

Such a substrate processing apparatus typically applies a plurality of successive processings to a single substrate. The substrate processing apparatus as described in JP 2003-324139 A comprises an indexer block, an anti-reflection film processing block, a resist film processing block, a development processing block, and an interface block. An exposure device is arranged adjacent to the interface block as an external device separate from the substrate processing apparatus.

In the above-described substrate processing apparatus, a substrate is carried from the indexer block into the anti-reflection film processing block and the resist film processing block, where the formation of an anti-reflection film and resist film coating processing are applied to the substrate. The substrate is then carried to the exposure device through the interface block. After exposure processing has been applied to the resist film on the substrate by the exposure device, the substrate is transported to the development processing block through the interface block. In the development processing block, development processing is applied to the resist film on the substrate to form a resist pattern thereon, and the substrate is subsequently carried into the indexer block.

With recent improvements in the density and integration of devices, making finer resist patterns have become very important. Conventional exposure devices typically perform exposure processing by providing reduction projection of a reticle pattern on a substrate through a projection lens. With such conventional exposure devices, however, the line width of an exposure pattern is determined by the wavelength of the light source of an exposure device, thus making it impossible to make a resist pattern finer than that.

For this reason, a liquid immersion method is suggested as a projection exposure method allowing for finer exposure patterns (refer to, e.g., WO99/49504 pamphlet). In the projection exposure device according to the WO99/49504 pamphlet, a liquid is filled between a projection optical system and a substrate, resulting in a shorter wavelength of exposure light on a surface of the substrate. This allows for a finer exposure pattern.

However, in the projection exposure device according to the aforementioned WO99/49504 pamphlet, exposure processing is performed with the substrate and the liquid being in contact with each other. Accordingly, the substrate to which the liquid adheres is transported out of the exposure device. Thus, when combining the substrate processing apparatus according to the aforementioned JP 2003-324139 A with the exposure device using the liquid immersion method as described in the aforementioned WO99/49504 pamphlet as an external device, the liquid adhering to the substrate that has been carried out of the exposure device may drop in the substrate processing apparatus, causing operational troubles such as abnormalities in the electric system of the substrate processing apparatus.

There is also a possibility that the substrate is contaminated by, e.g., residual droplets after the exposure processing and the eluate from an organic film on the substrate, causing processing defects in the substrate in subsequent processing steps.

SUMMARY OF THE INVENTION

It is an object of the present invention to provide a substrate processing apparatus and a substrate processing method in which operational troubles due to a liquid attached to substrates in an exposure device are prevented.

Another object of the present invention is to provide a substrate processing apparatus in which processing defects in substrates due to the contamination after exposure processing are prevented.

(1)

A substrate processing apparatus according to one aspect of the present invention that is arranged adjacent to an exposure device comprises a processing section for applying processing to a substrate, and an interface for exchanging the substrate between the processing section and the exposure device, wherein the processing section includes a first processing unit that dries the substrate, the interface includes a transport device that transports the substrate between the processing section and the exposure device, and the transport device transports the substrate that has been carried out of the exposure device to the first processing unit.

In the substrate processing apparatus, the substrate is subjected to given processing by the processing section, and then transported to the exposure device by the transport device. After the substrate is subjected to exposure processing by the exposure device, the substrate is transported to the first processing unit by the transport device. The substrate is dried by the first processing unit, and then transported to the processing section by the transport device.

In this way, the substrate after the exposure processing is dried by the first processing unit, and then transported to the processing section. This prevents a liquid attached to the substrate in the exposure device from dropping in the substrate processing apparatus. As a result, the substrate processing apparatus can be prevented from operational troubles.

(2)

The first processing unit may dry the substrate by supplying an inert gas onto the substrate. The use of the inert gas prevents a chemical influence upon a film on the substrate while drying the substrate reliably.

(3)

The interface may further include a second processing unit that applies given processing to the substrate and a platform on which the substrate is temporarily mounted, and the transport device may include a first transport unit that transports the substrate between the processing section, the second processing unit, and the platform, and a second transport unit that transports the substrate between the platform, the exposure device, and the first processing unit, and wherein the second transport unit may transport the substrate that has been carried out of the exposure device to the first processing unit.

In this case, the substrate is subjected to the given processing by the processing section, and then transported to the second processing unit by the first transport unit. After the substrate is subjected to the given processing by the second processing unit, the substrate is transported onto the platform by the first transport unit. Then, the substrate is transported from the platform into the exposure device by the second transport unit. After the substrate is subjected to the exposure processing by the exposure device, the substrate is transported to the first processing unit by the second transport unit. The substrate is dried by the first processing unit, and then transported onto the platform by the second transport unit. The substrate is subsequently transported from the platform onto the processing section by the first transport unit.

In this way, the substrate after the exposure processing is dried by the first processing unit, and then transported onto the platform. This prevents a liquid attached to the substrate in the exposure device from dropping in the substrate processing apparatus. As a result, the substrate processing apparatus can be prevented from operational troubles.

(4)

The second transport unit may comprise a first holder and a second holder each for holding the substrate, the second transport unit may hold the substrate with the first holder when transporting the substrate from the platform to the exposure device and from the first processing unit to the platform, and the second transport unit may hold the substrate with the second holder when transporting the substrate from the exposure device to the first processing unit.

In this way, the first holder is used when transporting the substrate to which a liquid is not attached before the exposure processing and after the drying processing, while the second holder is used when transporting the substrate to which a liquid is attached immediately after the exposure processing. This prevents the liquid from attaching to the first holder. Moreover, since the substrate after the drying processing is transported with the first holder, a liquid is prevented from attaching to the substrate after the drying processing.

(5)

The second holder may be provided below the first holder. In this case, even if a liquid drops from the second holder and the substrate held thereon, the liquid will not attach to the first holder and the substrate held thereon. The liquid is thus reliably prevented from attaching to the substrate after the drying processing.

(6)

The second processing unit may include an edge exposure unit for subjecting a peripheral portion of the substrate to exposure processing. The peripheral portion of the substrate is thus subjected to exposure by the edge exposure unit.

(7)

The processing section may further include a third processing unit that forms a photosensitive film made of a photosensitive material on the substrate before exposure processing by the exposure device.

In this case, the substrate is dried by the first processing unit after an exposure pattern has been formed on the photosensitive film by the exposure device. This prevents the components of the photosensitive material from eluting in the liquid attached to the substrate during exposure. This prevents the deformation of the exposure pattern formed on the photosensitive film. As a result, the substrate can be prevented from processing defects.

(8)

The first processing unit may further clean the substrate before drying the substrate.

In this case, even if a liquid attaches to the substrate during exposure, and particles and the like in the atmosphere attach to the substrate while being transported from the exposure device to the first processing unit, the deposits can be removed reliably. This prevents the substrate from processing defects reliably.

(9)

The first processing unit may comprise a substrate holding device that holds the substrate substantially horizontally, a rotation-driving device that rotates the substrate held on the substrate holding device about an axis vertical to the substrate, a cleaning liquid supplier that supplies a cleaning liquid onto the substrate held on the substrate holding device, and an inert gas supplier that supplies an inert gas onto the substrate after the cleaning liquid has been supplied onto the substrate by the cleaning liquid supplier.

In the first processing unit, the substrate is held on the substrate holding device substantially horizontally, and the substrate is rotated about the axis vertical to the substrate by the rotation-driving device. Then, the cleaning liquid is supplied onto the substrate from the cleaning liquid supplier, followed by the supply of the inert gas from the inert gas supplier.

In this case, since the substrate is rotated as the cleaning liquid is supplied onto the substrate, the cleaning liquid on the substrate moves toward the peripheral portion of the substrate by the centrifugal force and splashed away. This reliably prevents the deposits of particles and the like removed by the cleaning liquid from remaining on the substrate. In addition, since the substrate is rotated as the inert gas is supplied onto the substrate, the cleaning liquid remaining on the substrate after the cleaning of the substrate is efficiently removed. This reliably prevents the deposits of particles and the like from remaining on the substrate while reliably drying the substrate. As a result, the substrate can be prevented from operational troubles reliably.

(10)

The inert gas supplier may supply the inert gas so that the cleaning liquid supplied onto the substrate from the cleaning liquid supplier is removed from the substrate as the cleaning liquid moves outwardly from the center of the substrate.

This prevents the cleaning liquid from remaining on the center of the substrate, thus reliably preventing the generation of dry marks (dry stains) on a surface of the substrate. As a result, the substrate can be reliably prevented from processing defects.

(11)

The first processing unit may further comprise a rinse liquid supplier that supplies a rinse liquid onto the substrate after the supply of the cleaning liquid from the cleaning liquid supplier and before the supply of the inert gas from the inert gas supplier.

This allows the cleaning liquid to be reliably cleaned away by the rinse liquid, thus reliably preventing the deposits of particles and the like from remaining on the substrate.

(12)

The inert gas supplier may supply the inert gas so that the rinse liquid supplied onto the substrate from the rinse liquid supplier is removed from the substrate as the rinse liquid moves outwardly from the center of the substrate.

This prevents the rinse liquid from remaining on the center of the substrate, thus reliably preventing the generation of dry marks on the surface of the substrate. Accordingly, the substrate can be prevented from processing defects reliably.

(13)

The processing section may include a chemical solution processing unit that treats the substrate with a chemical solution, and a thermal processing unit that thermally treats the substrate.

In this case, the substrate is subjected to given treatment with a chemical solution by the chemical solution processing unit, and subjected to given thermal treatment by the thermal processing unit. The substrate after the exposure processing is dried by the first processing unit, and then transported to the chemical solution processing unit and the thermal processing unit. Therefore, even if a liquid attaches to the substrate in the exposure device, the liquid will not drop into the chemical solution processing unit and the thermal processing unit.

(14)

A substrate processing method according to another aspect of the present invention for processing a substrate in a substrate processing apparatus that is arranged adjacent to an exposure device and comprises a processing section, a transport device, and a first processing unit comprises the steps of applying given processing to the substrate by the processing section, transporting the substrate that has been processed by the processing section to the exposure device by means of the transport device, transporting the substrate that has been carried out of the exposure device to the first processing unit by means of the transport device, drying the substrate by the first processing unit, and transporting the substrate that has been dried by the first processing unit to the processing section by means of the transport device.

In the substrate processing apparatus, the substrate is subjected to the given processing by the processing section, and then transported to the exposure device by the transport device. After the substrate is subjected to exposure processing by the exposure device, the substrate is transported to the first processing unit by the transport device. The substrate is dried by the first processing unit, and subsequently transported to the processing section by the transport device.

In this way, the substrate after the exposure processing is dried by the first processing unit, and then transported to the processing section. This prevents a liquid attached to the substrate in the exposure device from dropping in the substrate processing apparatus. As a result, the substrate processing apparatus can be prevented from operational troubles.

(15)

The method may further comprise the step of cleaning the substrate by the first processing unit, after the step of transporting the substrate to the first processing unit by means of the transport device and before the step of drying the substrate by the first processing unit.

Since the exposed substrate is thus cleaned by the first processing unit, even if a liquid attaches to the substrate during exposure, and particles and the like in the atmosphere attach to the substrate during the transport of the substrate from the exposure device to the second processing unit, the deposits can be removed reliably. Accordingly, the substrate can be prevented from processing defects reliably.

(16)

A substrate processing apparatus according to still another aspect of the present invention that is arranged adjacent to an exposure device comprises a processing section for applying processing to a substrate, and an interface for exchanging the substrate between the processing section and the exposure device, wherein the processing section includes a first processing unit that cleans the substrate with a fluid nozzle that supplies a fluid mixture containing a liquid and a gas onto the substrate, the interface includes a transport device that transports the substrate between the processing section and the exposure device, and the transport device transports the substrate that has been carried out of the exposure device to the first processing unit.

In the substrate processing apparatus, the substrate is subjected to the given processing by the processing section, and then transported to the exposure device by the transport device. After the substrate is subjected to exposure processing by the exposure device, the substrate is transported to the first processing unit by the transport device. The substrate is cleaned by the first processing unit, and subsequently transported to the processing section by the transport device.

In this way, the substrate after the exposure processing is subjected to cleaning processing by the first processing unit, and then transported to the processing section. The fluid mixture containing a gas and a liquid is supplied onto the substrate from the fluid nozzle in the first processing unit.

Since the fluid mixture discharged from the fluid nozzle contains fine droplets, any contaminants attached on the surface of the substrate are stripped off, even if the surface has irregularities. This reliably removes the contaminants on the surface of the substrate. Moreover, even if the film on the substrate has low wettability, the fine droplets strip off the contaminants on the substrate surface, so that the contaminants can be reliably removed from the substrate surface. As a result of the foregoing, the substrate can be prevented from processing defects due to the contamination after the exposure processing.

In addition, adjusting the flow rate of the gas allows adjustments to be easily made to the detergency in cleaning the substrate. Thus, when the film on the substrate is prone to damage, damage to the film on the substrate can be prevented by weakening the detergency. Tough contaminants on the substrate surface can also be removed reliably by strengthening the detergency. By adjusting the detergency in this way according to the properties of the film on the substrate and the degree of contamination, it is possible to prevent damage to the film on the substrate while cleaning the substrate reliably.

(17)

The first processing unit may apply cleaning processing to the substrate by supplying a fluid mixture containing an inert gas and a cleaning liquid onto the substrate from the fluid nozzle.

The use of the inert gas prevents a chemical influence upon the film on the substrate and the cleaning liquid while removing the contaminants on the substrate surface more reliably. As a result, the substrate can be sufficiently prevented from processing defects due to the contamination after the exposure processing.

(18)

The first processing unit may apply drying processing to the substrate after the cleaning processing to the substrate.

In this case, the substrate after the exposure processing is subjected to the cleaning and drying processings by the first processing unit, and then transported to the processing section. This prevents a liquid attached to the substrate during the exposure processing or the cleaning processing of the substrate from dropping in the substrate processing apparatus. As a result, the substrate processing apparatus can be prevented from operational troubles such as abnormalities in the electric system.

(19)

The first processing unit may include an inert gas supplier that applies drying processing to the substrate by supplying an inert gas onto the substrate. The use of the inert gas prevents a chemical influence upon the film on the substrate while reliably drying the substrate.

(20)

The fluid nozzle may function as the inert gas supplier. In this case, the inert gas is supplied onto the substrate from the fluid nozzle to apply drying processing to the substrate. This obviates the need to provide the inert gas supplier separately from the fluid nozzle. As a result, the cleaning and drying processings can be reliably applied to the substrate with a simple structure.

(21)

The first processing unit may further include a substrate holding device that holds the substrate substantially horizontally, and a rotation-driving device that rotates the substrate held on the substrate holding device about an axis vertical to the substrate.

In the first processing unit, the substrate is held on the substrate holding device substantially horizontally, and the substrate is rotated about the axis vertical to the substrate by the rotation-driving device. Further, the fluid mixture containing the inert gas and the cleaning liquid is supplied onto the substrate from the fluid nozzle, followed by the supply of the inert gas from the inert gas supplier.

In this case, since the substrate is rotated as the fluid mixture is supplied onto the substrate, the fluid mixture on the substrate moves toward the peripheral portion of the substrate by the centrifugal force and splashed away. This reliably prevents the deposits of particles and the like removed by the fluid mixture from remaining on the substrate. In addition, since the substrate is rotated as the inert gas is supplied onto the substrate, the fluid mixture remaining on the substrate after the cleaning of the substrate is efficiently removed. This reliably prevents the deposits of particles and the like from remaining on the substrate while drying the substrate reliably. As a result, the substrate can be prevented from operational troubles reliably.

(22)

The first processing unit may supply the inert gas so that the fluid mixture supplied onto the substrate from the fluid nozzle is removed from the substrate as the fluid mixture moves outwardly from the center of the substrate.

This prevents the fluid mixture from remaining on the center of the substrate, thus reliably preventing the generation of dry marks on a surface of the substrate. Accordingly, the substrate can be prevented from processing defects reliably.

(23)

The first processing unit may further include a rinse liquid supplier that supplies a rinse liquid onto the substrate, after the supply of the fluid mixture from the fluid nozzle and before the supply of the inert gas from the inert gas supplier.

This allows the fluid mixture to be reliably cleaned away by the rinse liquid, thus reliably preventing the deposits of particles and the like from remaining on the substrate.

(24)

The fluid nozzle may function as the rinse liquid supplier. In this case, the rinse liquid is supplied from the fluid nozzle. This obviates the need to provide the rinse liquid supplier separately from the fluid nozzle. As a result, the cleaning and drying processings can be reliably applied to the substrate with a simple structure.

(25)

The first processing unit may supply the inert gas so that the rinse liquid supplied onto the substrate from the rinse liquid supplier is removed from the substrate as the rinse liquid moves outwardly from the center of the substrate.

This prevents the rinse liquid from remaining on the center of the substrate, thus reliably preventing the generation of dry marks on the surface of the substrate. Accordingly, the substrate can be reliably prevented from processing defects.

(26)

The fluid nozzle may have a liquid flow passage through which a liquid flows, a gas flow passage through which a gas flows, a liquid discharge port having an opening that communicates with the liquid flow passage, and a gas discharge port that is provided near the liquid discharge port and having an opening that communicates with the gas flow passage.

In this case, the liquid flows through the liquid flow passage, and discharged from the liquid discharge port, while the gas flows through the gas flow passage, and discharged from the gas discharge port. The liquid and gas are mixed outside the fluid nozzle. A mist-like fluid mixture is thus generated.

In this way, the fluid mixture is generated by mixing the liquid and the gas outside the fluid nozzle. This obviates the need to provide space for mixing the liquid and the gas inside the fluid nozzle. As a result, the size of the fluid nozzle can be reduced.

(27)

A substrate processing method according to still another aspect of the present invention for processing a substrate in a substrate processing apparatus that is arranged adjacent to an exposure device and comprises a processing section, a transport device, and a first processing unit comprises the steps of applying given processing to a substrate by the processing section, transporting the substrate that has been processed by the processing section to the exposure device by means of the transport device, transporting the substrate that has been carried out of the exposure device to the first processing unit by means of the transport device, cleaning the substrate with a fluid nozzle that supplies a fluid mixture containing a liquid and a gas onto the substrate in the first processing unit, and transporting the substrate that has been cleaned by the first processing unit to the processing section by means of the transport device.

In the substrate processing method, the substrate is subjected to the given processing by the processing section, and then transported to the exposure device by the transport device. After the substrate is subjected to exposure processing by the exposure device, the substrate is transported to the first processing unit by the transport device. The substrate is cleaned by the first processing unit, and subsequently transported to the processing section by the transport device.

In this way, the substrate after the exposure processing is subjected to cleaning processing by the first processing unit, and then transported to the processing section. The fluid mixture containing a gas and a liquid is supplied onto the substrate from the fluid nozzle in the first processing unit.

Since the fluid mixture discharged from the fluid nozzle contains fine droplets, any contaminants attached on a surface of the substrate are stripped off, even if the surface has irregularities. This reliably removes the contaminants on the surface of the substrate. Moreover, even if the film on the substrate has low wettability, the fine droplets strip off the contaminants on the substrate surface, so that the contaminants can be reliably removed from the substrate surface. As a result of the foregoing, the substrate can be prevented from processing defects due to the contamination after the exposure processing.

In addition, adjusting the flow rate of the gas allows adjustments to be easily made to the detergency in cleaning the substrate. Thus, when the film on the substrate are prone to damage, damage to the film on the substrate can be prevented by weakening the detergency. Tough contaminants on the substrate surface can also be removed reliably by strengthening the detergency. By adjusting the detergency in this way according to the properties of the film on the substrate and the degree of contamination, it is possible to prevent damage to the film on the substrate while cleaning the substrate reliably.

(28)

The method may further comprise the step of drying the substrate by the first processing unit, after the step of cleaning the substrate by the first processing unit and before the step of transporting the substrate that has been cleaned by the first processing unit to the processing section by means of the transport device.

In this case, the substrate after the exposure processing is subjected to the cleaning and drying processings by the first processing unit, and then transported to the processing section. This prevents a liquid attached to the substrate during the exposure processing or the cleaning processing of the substrate from dropping in the substrate processing apparatus. As a result, the substrate processing apparatus can be prevented from operational troubles such as abnormalities in the electric system. Moreover, drying the substrate after cleaning prevents particles and the like in the atmosphere from adhering to the substrate, thus preventing contamination of the substrate. This prevents the substrate from processing defects.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 6 is a schematic diagram of a nozzle in which a nozzle for cleaning processing and a nozzle for drying processing are formed integrally;

FIG. 9 is a schematic diagram showing another example of the nozzle for drying processing;

FIG. 13 is a longitudinal cross section showing an example of the internal structure of a two-fluid nozzle for use in cleaning and drying processings.

DESCRIPTION OF THE PREFERRED EMBODIMENTS

A substrate processing apparatus according to embodiments of the invention will be described below with reference to the drawings. A substrate as used in the specification includes a semiconductor substrate, a substrate for a liquid crystal display, a substrate for a plasma display, a glass substrate for a photomask, a substrate for an optical disk, a substrate for a magnetic disk, a substrate for a magneto-optical disk, and a substrate for a photomask.

(1) First Embodiment (1-1) Configuration of Substrate Processing Apparatus

Figure 1:
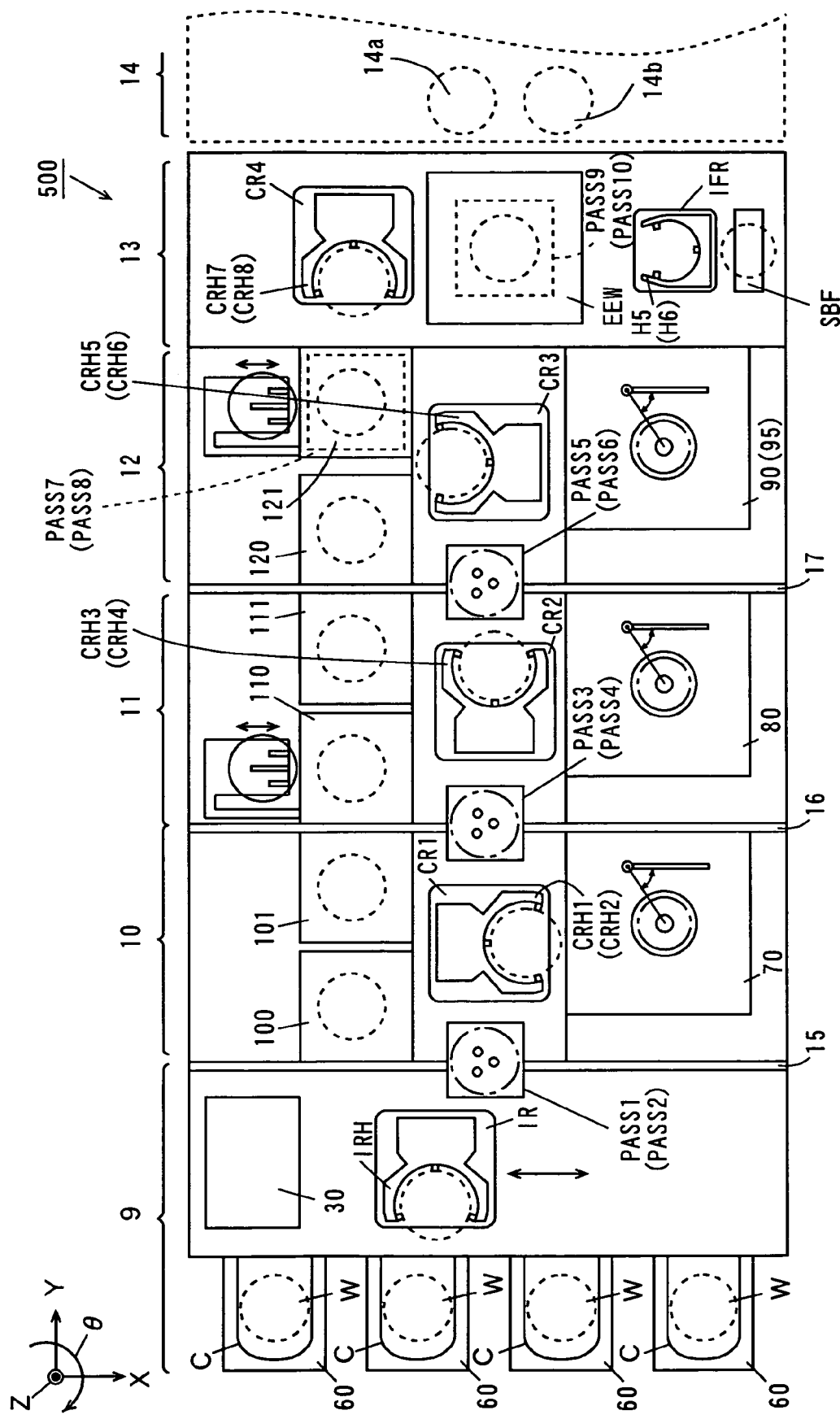
FIG. 1 is a plan view of a substrate processing apparatus according to a first embodiment of the invention.

FIG. 1 is a plan view of a substrate processing apparatus according to a first embodiment of the invention.

FIG. 1 and each of the subsequent drawings is accompanied by the arrows that indicate X, Y, and Z directions perpendicular to one another, for clarification of positions. The X and Y directions are perpendicular to each other in a horizontal plane, and the Z direction corresponds to the vertical direction. In each of the directions, the direction toward an arrow is defined as + direction, and the opposite direction is defined as − direction. The rotation direction about the Z direction is defined as θ direction.

As shown in FIG. 1, the substrate processing apparatus 500 includes an indexer block 9, an anti-reflection film processing block 10, a resist film processing block 11, a drying/development processing block 12, and an interface block 13. An exposure device 14 is arranged adjacent to the interface block 13. The exposure device 14 applies exposure processing to substrates W by a liquid immersion method.

Each of the indexer block 9, anti-reflection film processing block 10, resist film processing block 11, drying/development processing block 12, and interface block 13 will hereinafter be referred to as a processing block.

The indexer block 9 includes a main controller (controller) 30 for controlling the operation of each processing block, a plurality of carrier platforms 60, and an indexer robot IR. The indexer robot IR has a hand IRH for receiving and transferring the substrates W.

The anti-reflection film processing block 10 includes thermal processing groups 100, 101 for anti-reflection film, a coating processing group 70 for anti-reflection film, and a first central robot CR1. The coating processing group 70 is arranged opposite to the thermal processing groups 100, 101 with the first central robot CR1 therebetween. The first central robot CR1 has hands CRH1, CRH2 provided one above the other for receiving and transferring the substrates W.

A partition wall 15 is arranged between the indexer block 9 and the anti-reflection film processing block 10 for shielding an atmosphere. The partition wall 15 has substrate platforms PASS1, PASS2 provided closely one above the other for receiving and transferring the substrates W between the indexer block 9 and the anti-reflection film processing block 10. The upper substrate platform PASS1 is used in transferring the substrates W from the indexer block 9 to the anti-reflection film processing block 10, and the lower substrate platform PASS2 is used in transferring the substrates W from the anti-reflection film processing block 10 to the indexer block 9.

Each of the substrate platforms PASS1, PASS2 has an optical sensor (not shown) for detecting the presence or absence of a substrate W. This enables a determination to be made whether or not a substrate W is on the substrate platform PASS1, PASS2. In addition, each of the substrate platforms PASS1, PASS2 has a plurality of support pins secured thereto. Note that each of substrate platforms PASS3 to PASS10 mentioned below similarly has such optical sensor and support pins.

The resist film processing block 11 includes thermal processing groups 110, 111 for resist film, a coating processing group 80 for resist film, and a second central robot CR2. The coating processing group 80 is arranged opposite to the thermal processing groups 110, 111 with the second central robot CR2 therebetween. The second central robot CR2 has hands CRH3, CRH4 provided one above the other for receiving and transferring the substrates W.

A partition wall 16 is arranged between the anti-reflection film processing block 10 and the resist film processing block 11 for shielding an atmosphere. The partition wall 16 has substrate platforms PASS3, PASS4 provided closely one above the other for receiving and transferring the substrates W between the anti-reflection film processing block 10 and the resist film processing block 11. The upper substrate platform PASS3 is used in transferring the substrates W from the anti-reflection film processing block 10 to the resist film processing block 11. The lower substrate platform PASS4 is used in transferring the substrates W from the resist film processing block 11 to the anti-reflection film processing block 10.

The drying/development processing block 12 includes thermal processing groups 120, 121 for development, a development processing group 90, a drying processing group 95, and a third central robot CR3. The thermal processing group 121, adjacent to the interface block 13, has substrate platforms PASS7, PASS8 as described below. The development processing group 90 and the drying processing group 95 are arranged opposite to the thermal processing groups 120, 121 with the third central robot CR3 therebetween. The third central robot CR3 has hands CRH5, CRH6 provided one above the other for receiving and transferring the substrates W.

A partition wall 17 is arranged between the resist film processing block 11 and the drying/development processing block 12 for shielding an atmosphere. The partition wall 17 has substrate platforms PASS5, PASS6 provided closely one above the other for receiving and transferring the substrates W between the resist film processing block 11 and the drying/development processing block 12. The upper substrate platform PASS5 is used in transferring the substrates W from the resist film processing block 11 to the drying/development processing block 12, and the lower substrate platform PASS6 is used in transferring the substrates W from the drying/development processing block 12 to the resist film processing block 11.

The interface block 13 includes a fourth central robot CR4, a buffer SBF, an interface transport mechanism IFR, and edge exposure units EEW. A return buffer unit RBF1, substrate platforms PASS 9, PASS10, and a return buffer unit RBF2 are provided under the edge exposure units EEW as described below. The fourth central robot CR4 has hands CRH7, CRH8 provided one above the other for receiving and transferring the substrates W.

The interface transport mechanism IFR has a hand H5 and a hand H6 for receiving and transferring the substrates W. The interface transport mechanism IFR exchanges the substrates W between the substrate platform PASS9 and the exposure device 14, between the exposure device 14 and the drying processing group 95, and between the drying processing group 95 and the substrate platform PASS10. The interface transport mechanism IFR will be described in detail below.

In the substrate processing apparatus 500 of the embodiment, the indexer block 9, the anti-reflection film processing block 10, resist film processing block 11, drying/development processing block 12, and interface block 13 are sequentially arranged in parallel along the Y direction.

Figure 2:
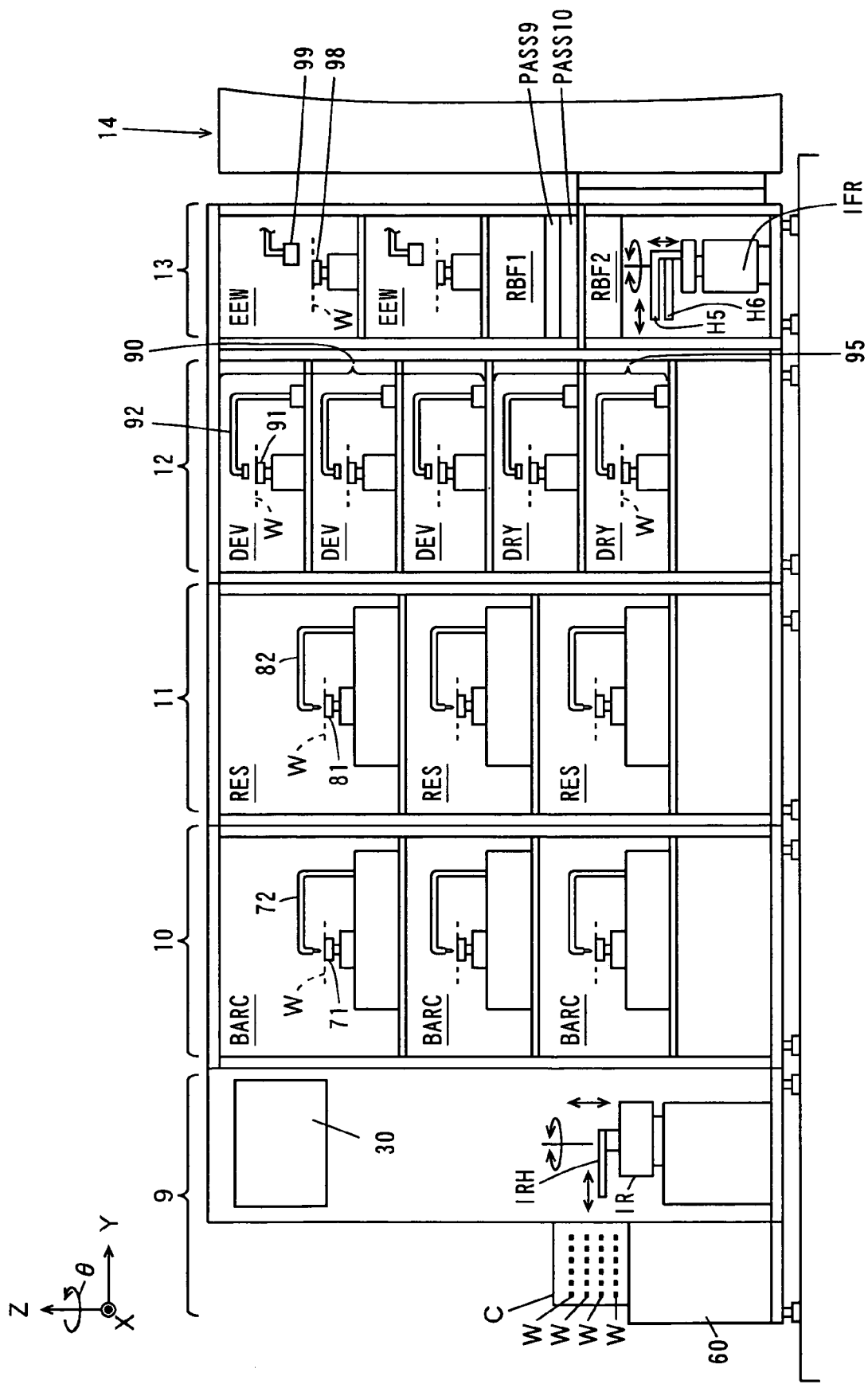
FIG. 2 is a side view of the substrate processing apparatus in FIG. 1 that is seen from the +X direction.

FIG. 2 is a side view of the substrate processing apparatus 500 in FIG. 1 that is seen from the +X direction.

The coating processing group 70 in the anti-reflection film processing block 10 (see FIG. 1) includes a vertical stack of three coating units BARC. Each of the coating units BARC comprises a spin chuck 71 for rotating a substrate W while holding the substrate W in a horizontal attitude by suction, and a supply nozzle 72 for supplying coating liquid for an anti-reflection film to the substrate W held on the spin chuck 71.

The coating processing group 80 in the resist film processing block 11 (see FIG. 1) includes a vertical stack of three coating units RES. Each of the coating units RES comprises a spin chuck 81 for rotating a substrate W while holding the substrate W in a horizontal attitude by suction, and a supply nozzle 82 for supplying coating liquid for a resist film to the substrate W held on the spin chuck 81.

The drying/development processing block 12 includes a vertical stack of the development processing group 90 and the drying processing group 95. The development processing group 90 includes a vertical stack of three development processing units DEV. Each of the development processing units DEV comprises a spin chuck 91 for rotating a substrate W while holding the substrate W in a horizontal attitude by suction, and a supply nozzle 92 for supplying development liquid to the substrate W held on the spin chuck 91.

The drying processing group 95 includes a vertical stack of two drying processing units DRY. The drying processing units DRY apply cleaning and drying processings to the substrates W. The drying processing units DRY will be described in detail below.

The interface block 13 includes a vertical stack of two edge exposure units EEW, a return buffer unit RBF1, substrate platforms PASS9, PASS10, and a return buffer unit RBF2, and also includes the fourth central robot CR4 (see FIG. 1) and interface transport mechanism IFR. Each of the edge exposure units EEW comprises a spin chuck 98 for rotating a substrate W while holding the substrate W in a horizontal attitude by suction, and a light irradiator 99 for subjecting a peripheral edge of the substrate W held on the spin chuck 98 to exposure.

Figure 3:
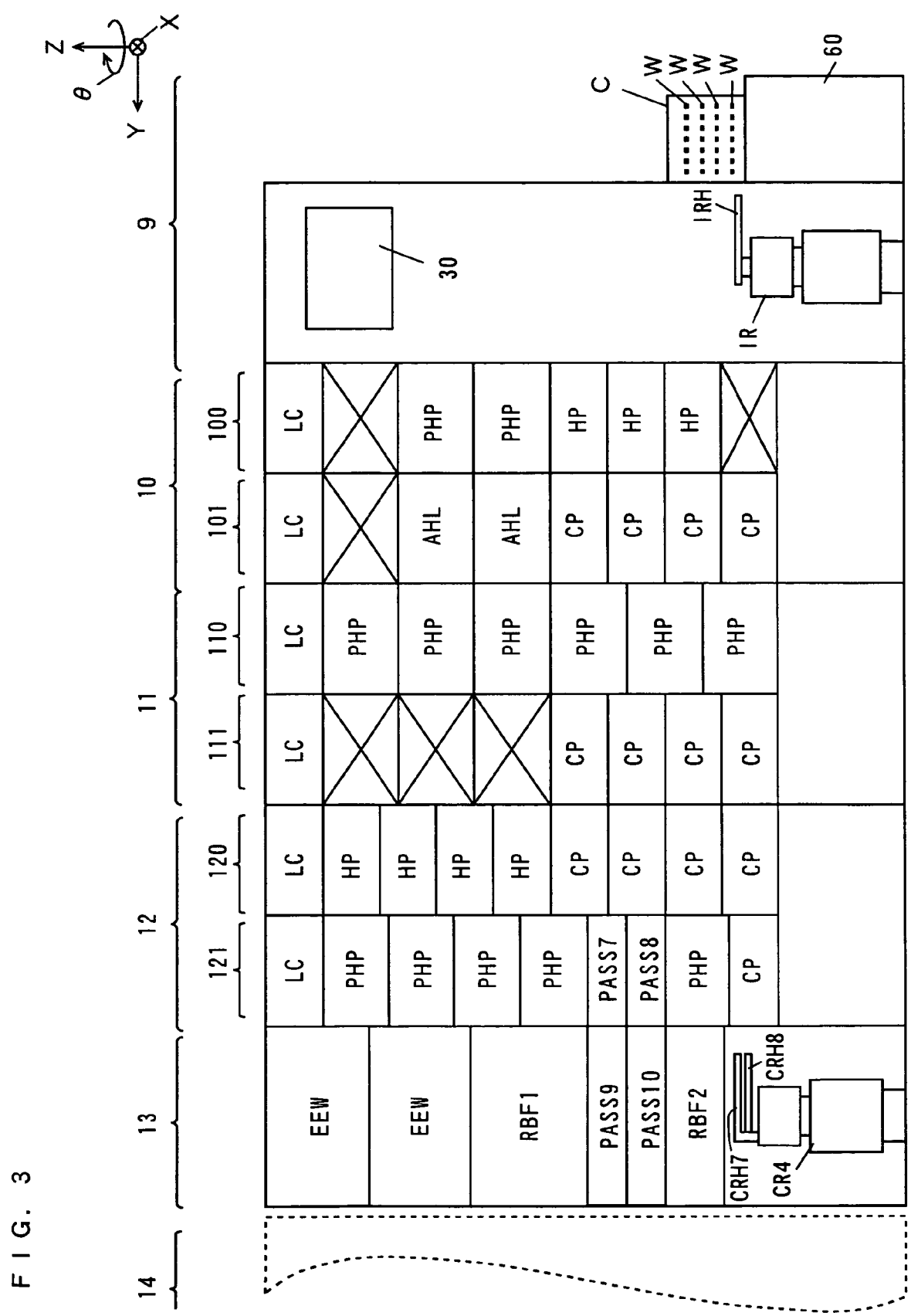
FIG. 3 is a side view of the substrate processing apparatus in FIG. 1 that is seen from the −X direction.

FIG. 3 is a side view of the substrate processing apparatus 500 in FIG. 1 that is seen from the −X direction.

In the anti-reflection film processing block 10, the thermal processing group 100 includes a vertical stack of two thermal processing units PHP each having an interface unit (hereinafter simply referred to as thermal processing units) and three hot plates HP, and the thermal processing group 101 includes a vertical stack of two adhesion agent coating processing units AHL and four cooling plates CP. The thermal processing group 100 also includes a local controller LC on top thereof for controlling the temperatures of the thermal processing units PHP and the hot plates HP, and the thermal processing group 101 also includes a local controller LC on top thereof for controlling the temperatures of the adhesion agent coating processing units AHL and the cooling plates CP.

In the resist film processing block 11, the thermal processing group 110 includes a vertical stack of six thermal processing units PHP, and the thermal processing group 111 includes a vertical stack of four cooling plates CP. The thermal processing group 110 also includes a local controller LC on top thereof for controlling the temperatures of the thermal processing units PHP, and the thermal processing group 111 also includes a local controller LC on top thereof for controlling the temperatures of the cooling plates CP.

In the drying/development processing block 12, the thermal processing group 120 includes a vertical stack of four hot plates HP and four cooling plates CP, and the thermal processing group 121 includes a vertical stack of four thermal processing units PHP, substrate platforms PASS7, PASS8, a thermal processing unit PHP and a cooling plate CP. The thermal processing group 120 also includes a local controller LC on top thereof for controlling the temperatures of the hot plates HP and the cooling plates CP, and the thermal processing group 121 also includes a local controller LC for controlling the temperatures of the thermal processing units PHP and the cooling plate CP.

(1-2) Operation of Substrate Processing Apparatus

Next, the operation of the substrate processing apparatus 500 in this embodiment will be described.

Carriers C for storing the substrates W in multiple stages are mounted on the carrier platforms 60, respectively, in the indexer block 9. The indexer robot IR takes out a substrate W yet to be processed which is stored in a carrier C using the hand IRH. Then, the indexer robot IR moves in the ±X direction while rotating in the ±θ direction to transfer the unprocessed substrate W onto the substrate platform PASS1.

Although FOUPs (Front Opening Unified Pods) are adopted as the carriers C in this embodiment, SMIF (Standard Mechanical Inter Face) pods or OCs (Open Cassettes) that expose stored substrates W to outside air may also be used, for example. In addition, although linear-type transport robots that move their hands forward or backward by sliding them linearly to a substrate W are used as the indexer robot IR, the first central robot CR1 to the fourth central robot CR4, and the interface transport mechanism IFR, multi-joint type transport robots that linearly move their hands forward and backward by moving their joints may also be used.

The unprocessed substrate W that has been transferred onto the substrate platform PASS1 is received by the hand CRH1 of the first central robot CR1 in the anti-reflection film processing block 10. The first central robot CR1 carries the substrate W to the thermal processing group 100 or 101 with the hand CRH1.

After this, the first central robot CR1 takes out the thermally treated substrate W from the thermal processing group 100 or 101 with the hand CRH2, and then carries the substrate W to the coating processing group 70. The coating processing group 70 forms a coating of an anti-reflection film over a lower portion of a photoresist film using a coating unit BARC, in order to reduce potential standing waves and halation generated during exposure.

The first central robot CR1 subsequently takes out the substrate W after the coating processing from the coating processing group 70 with the hand CRH1, and carries the substrate W to the thermal processing group 100 or 101. Then, the first central robot CR1 takes out the thermally treated substrate W from the thermal processing group 100 or 101 with the hand CRH2, and transfers the substrate W to the substrate platform PASS3.

The substrate W on the substrate platform PASS3 is received by the hand CRH3 of the second central robot CR2 in the resist film processing block 11. The second central robot CR2 carries the substrate W to the thermal processing group 110 or 111 with the hand CRH3.

The second central robot CR2 then takes out the thermally treated substrate W from the thermal processing group 110 or 111 with the hand CRH4, and transfers the substrate W to the coating processing group 80. The coating processing group 80 forms a coating of a photoresist film over the substrate W coated with the anti-reflection film by a coating unit RES.

After this, the second central robot CR2 takes out the substrate W after the coating processing from the coating processing group 80 with the hand CRH3, and carries the substrate to the thermal processing group 110 or 111. Then, the second central robot CR2 takes out the thermally treated substrate W from the thermal processing group 110 or 111 with the hand CRH4, and transfers the substrate W onto the substrate platform PASS5.

The substrate W on the substrate platform PASS5 is received by the hand CRH5 of the third central robot CR3 in the development processing block 12. The third central robot CR3 transfers the substrate W onto the substrate platform PASS7 with the hand CRH5. The substrate W on the substrate platform PASS7 is received by the hand CRH7 of the fourth central robot CR4 in the interface block 13. The fourth central robot CR4 transfers the substrate W to an edge exposure unit EEW with the hand CRH7. The edge exposure unit EEW applies exposure processing to the peripheral portion of the substrate W.

Then, the fourth central robot CR4 takes out the substrate W after the edge exposure processing from the edge exposure unit EEW with the hand CRH8. The fourth central robot then receives a cooled substrate from the cooling plate CP in the thermal processing group 121 with the hand CRH7, and simultaneously carries the aforementioned substrate W after the edge exposure processing with the hand CRH8 to the cooling plate CP in the thermal processing group 121. Then, the fourth central robot CR4 transfers the aforementioned cooled substrate W onto the substrate platform PASS9 with the hand CRH7.

The substrate W on the substrate platform PASS9 is carried into the exposure device 14 by the interface transport mechanism IFR. After exposure processing has been applied to the substrate W by the exposure device 14, the interface transport mechanism IFR transports the substrate W to a drying processing unit DRY. After cleaning and drying processings have been applied to the substrate W by the drying processing unit DRY, the interface transport mechanism IFR transfers the substrate W to the substrate platform PASS10. The interface transport mechanism IFR will be described below.

The substrate W on the substrate platform PASS10 is received by the hand CRH8 of the fourth central robot CR4 in the interface block 13. The fourth central robot CR4 carries the substrate W into the thermal processing group 121 in the drying/development processing block 12 with the hand CRH8. The thermal processing group 121 applies thermal treatment to the substrate W. After this, the fourth central robot CR4 takes out the substrate W from the thermal processing group 121 with the hand CRH8, and transfers the substrate W onto the substrate platform PASS8.

The substrate W on the substrate platform PASS8 is received by the hand CRH6 of the third central robot CR3 in the drying/development processing block 12. The third central robot CR3 carries the substrate W into the development processing group 90 with the hand CRH6. The development processing group 90 applies development processing to the exposed substrate W.

After this, the third central robot CR3 takes out the substrate W after the development processing from the development processing group 90 with the hand CRH5, and transfers the substrate W to the thermal processing group 120.

Then, the third central robot CR3 takes out the thermally treated substrate W from the thermal processing group 120 with the hand CRH6, and transfers the substrate W onto the substrate platform PASS6 in the resist film processing block 11.

If the development processing group 90 is temporarily not capable of applying development processing to the substrate W by, e.g., a failure, the substrate W may temporarily be stored in the return buffer RBF1 in the interface block 13 after the thermal treatment in the thermal processing group 121.

The substrate W on the substrate platform PASS6 is transferred onto the substrate platform PASS4 by the hand CRH4 of the second central robot CR2 in the resist film processing block 11. The substrate W on the substrate platform PASS4 is transferred onto the substrate platform PASS2 by the hand CRH2 of the first central robot CR1 in the anti-reflection film processing block 10.

The substrate W on the substrate platform PASS2 is stored in a carrier C by the indexer robot IR in the indexer block 9. Each of the processings to the substrate W in the substrate processing apparatus is thus completed.

(1-3) Drying Processing Unit

The aforementioned drying processing units DRY are now described in detail with reference to the drawings.

(1-3a) Configuration of Drying Processing Unit

Figure 4:
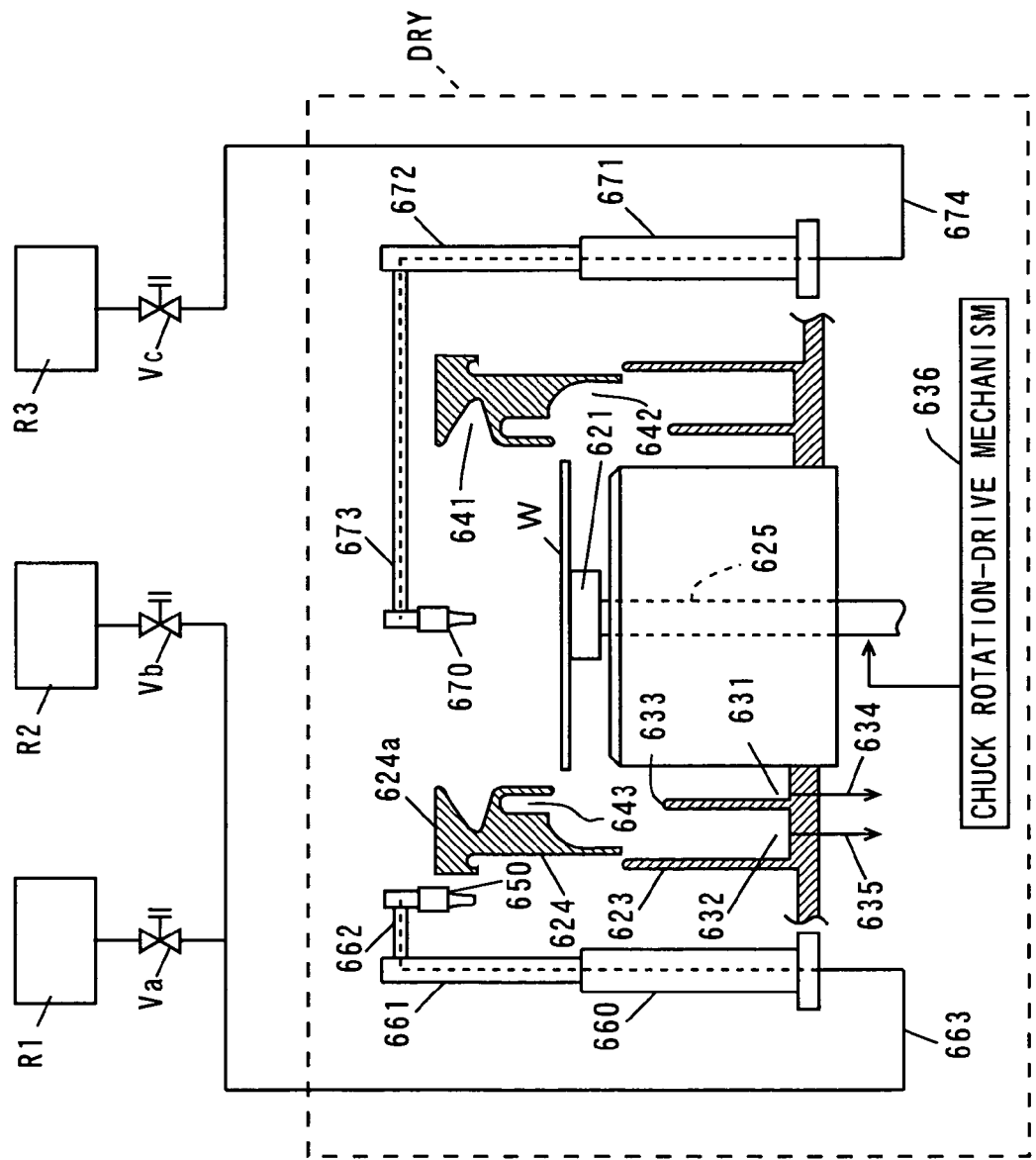
FIG. 4 is a diagram for use in illustrating the configuration of the drying processing unit.

The configuration of each of the drying processing units DRY is first described. FIG. 4 is a diagram for use in illustrating the configuration of the drying processing unit DRY.

As shown in FIG. 4, the drying processing unit DRY comprises a spin chuck 621 for rotating a substrate W about the vertical rotation axis passing through the center of the substrate W while horizontally holding the substrate W.

The spin chuck 621 is secured to an upper end of a rotation shaft 625, which is rotated via a chuck rotation-drive mechanism 636. An air suction passage (not shown) is formed in the spin chuck 621. With the substrate W being mounted on the spin chuck 621, air inside the air suction passage is discharged, so that a lower surface of the substrate W is sucked onto the spin chuck 621 by vacuum, and the substrate W is held in a horizontal attitude.

A first rotation motor 660 is arranged outside the spin chuck 621. The first rotation motor 660 is connected to a first rotation shaft 661. The first rotation shaft 661 is coupled to a first arm 662, which extends in the horizontal direction, and whose end is provided with a nozzle 650 for cleaning processing.

The first rotation shaft 661 is rotated by the first rotation motor 660, so that the first arm 662 swings. This causes the nozzle 650 to move above the substrate W held on the spin chuck 621.

A supply pipe 663 for cleaning processing is arranged so as to pass through the inside of the first rotation motor 660, first rotation shaft 661, and first arm 662. The supply pipe 663 is connected to a cleaning liquid supply source R1 and a rinse liquid supply source R2 through a valve Va and a valve Vb, respectively. Controlling the opening and closing of the valves Va, Vb allows the selection of the processing liquid supplied to the supply pipe 663 and adjustments of the amount thereof. In the configuration of FIG. 4, when the valve Va is opened, cleaning liquid is supplied to the supply pipe 663, and when the valve Vb is opened, rinse liquid is supplied to the supply pipe 663.

The cleaning liquid or the rinse liquid is supplied to the nozzle 650 through the supply pipe 663 from the cleaning liquid supply source R1 or the rinse liquid supply source R2. The cleaning liquid or the rinse liquid is thus supplied to a surface of the substrate W. Examples of the cleaning liquid may include pure water, a pure water solution containing a complex (ionized), or a fluorine-based chemical solution. Examples of the rinse liquid may include pure water, carbonated water, hydrogen water, electrolytic ionic water, and HFE (hydrofluoroether).

A second rotation motor 671 is arranged outside the spin chuck 621. The second rotation motor 671 is connected to a second rotation shaft 672. The second rotation shaft 672 is coupled to a second arm 673, which extends in the horizontal direction, and whose end is provided with a nozzle 670 for drying processing.

The second rotation shaft 672 is rotated by the second rotation motor 671, so that the second arm 673 swings. This causes the nozzle 670 to move above the substrate W held on the spin chuck 621.

A supply pipe 674 for drying processing is arranged so as to pass through the inside of the second rotation motor 671, second rotation shaft 672, and second arm 673. The supply pipe 674 is connected to an inert gas supply source R3 through a valve Vc. Controlling the opening and closing of the valve Vc allows adjustments to be made to the amount of the inert gas supplied to the supply pipe 674.

The inert gas is supplied to the nozzle 670 through the supply pipe 674 from the inert gas supply source R3. The inert gas is thus supplied to the surface of the substrate W. Nitrogen gas ($N_2$), for example, may be used as the inert gas.

When supplying the cleaning liquid or the rinse liquid onto the surface of the substrate W, the nozzle 650 is positioned above the substrate. When supplying the inert gas onto the surface of the substrate W, the nozzle 650 is retracted to a predetermined position.

When supplying the cleaning liquid or the rinse liquid onto the surface of the substrate W, the nozzle 670 is retracted to a predetermined position. When supplying the inert gas onto the surface of the substrate W, the nozzle 670 is positioned above the substrate W.

The substrate W held on the spin chuck 621 is housed in a processing cup 623. A cylindrical partition wall 633 is provided inside the processing cup 623. A discharge space 631 is formed so as to surround the spin chuck 621 for discharging the processing liquid (i.e., cleaning liquid or rinse liquid) used in processing the substrate W. Also, a liquid recovery space 632 is formed between the processing cup 623 and the partition wall 633, so as to surround the discharge space 631, for recovering the processing liquid used in processing the substrate W.

The discharge space 631 is connected with a discharge pipe 634 for directing the processing liquid to a liquid discharge processing device (not shown), while the liquid recovery space 632 is connected with a recovery pipe 635 for directing the processing liquid to a recovery processing device (not shown).

A guard 624 is provided above the processing cup 623 for preventing the processing liquid on the substrate W from splashing outward. The guard 624 is configured to be rotation-symmetric with respect to the rotation shaft 625. A liquid discharge guide groove 641 with a V-shaped cross section is formed in a circular shape inwardly of an upper end portion of the guard 624.

Also, a liquid recovery guide 642 having an inclined surface that inclines down outwardly is formed inwardly of a lower portion of the guard 624. A partition wall housing groove 643 for receiving the partition wall 633 in the processing cup 623 is formed in the vicinity of the upper end of the liquid recovery guide 642.

This guard 624 is provided with a guard lifting mechanism (not shown) composed of a ball screw mechanism or the like. The guard lifting mechanism lifts and lowers the guard 624 between a recovery position in which the liquid recovery guide 642 is positioned opposite to outer edges of the substrate W held on the spin chuck 621 and a discharge position in which the liquid discharge guide groove 641 is positioned opposite to the outer edges of the substrate W held on the spin chuck 621. When the guard 624 is in the recovery position (i.e., the position of the guard shown in FIG. 4), the processing liquid splashed out from the substrate W is directed by the liquid recovery guide 642 to the liquid recovery space 632, and then recovered through the recovery pipe 635. On the other hand, when the guard 624 is in the discharge position, the processing liquid splashed out from the substrate W is directed by the liquid discharge guide groove 641 to the discharge space 631, and then discharged through the discharge pipe 634. With the above-described configuration, discharge and recovery of the processing liquid is performed.

(1-3b) Operation of Drying Processing Unit

The processing operation of the drying processing unit DRY having the above-described configuration is next described. Note that the operation of each component in the drying processing unit DRY described below is controlled by the main controller 30 in FIG. 1.

When the substrate W is initially carried into the drying processing unit DRY, the guard 624 is lowered, and the interface transport mechanism IFR in FIG. 1 places the substrate W onto the spin chuck 621. The substrate W on the spin chuck 621 is held by suction.

Next, the guard 624 moves to the aforementioned discharge position, and the nozzle 650 moves above the center of the substrate W. Then, the rotation shaft 625 rotates, causing the substrate W held on the spin chuck 621 to rotate. After this, the cleaning liquid is discharged onto the top surface of the substrate W from the nozzle 650. This provides cleaning of the substrate W. Note that the supply of the cleaning liquid onto the substrate W may be executed by a soft spray method using a two-fluid nozzle. An example of the drying processing unit DRY using a two-fluid nozzle will be described in the second embodiment.

After the elapse of a predetermined time, the supply of the cleaning liquid is stopped, and the rinse liquid is discharged from the nozzle 650. The cleaning liquid on the substrate W is thus cleaned away.

Figure 5:
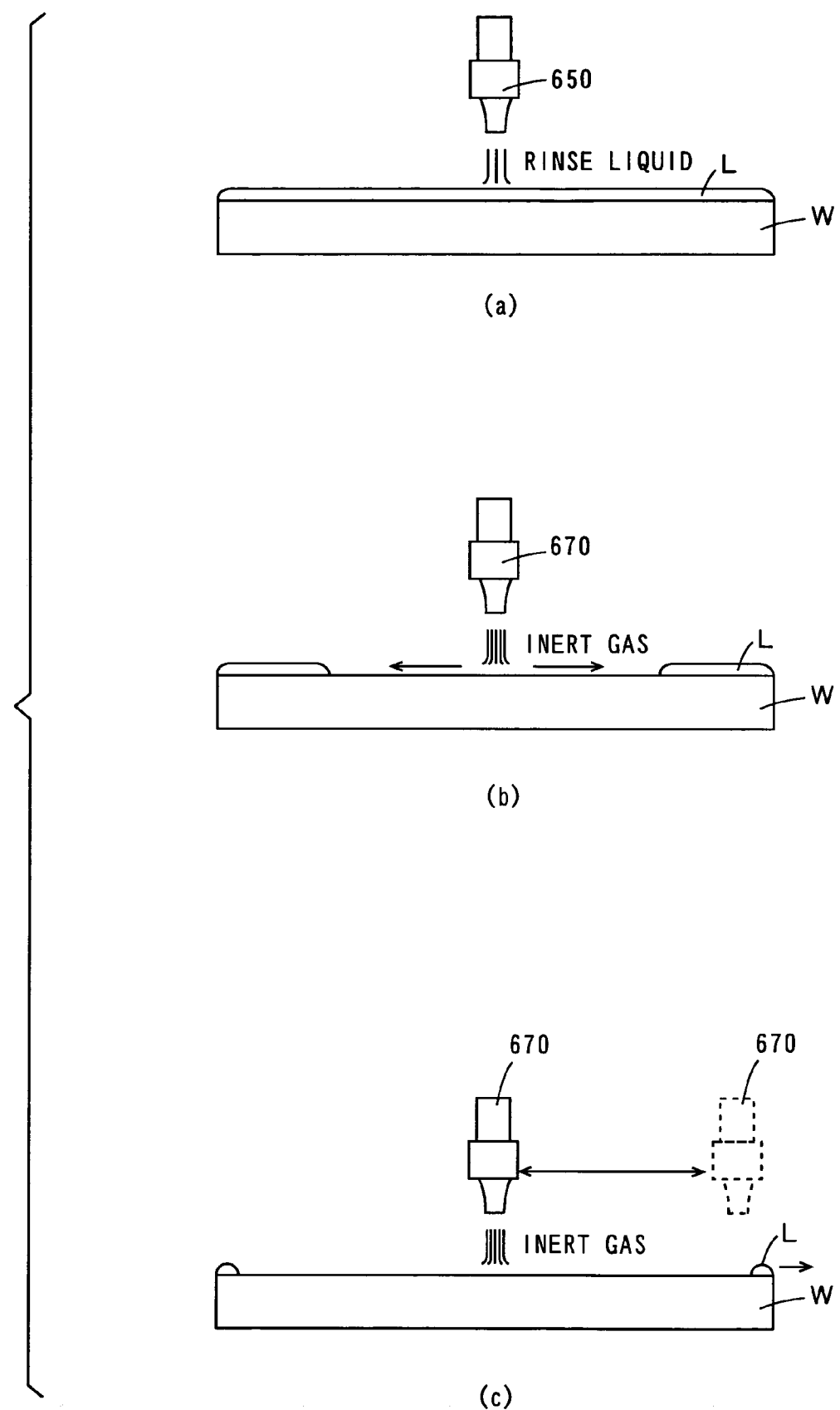
FIGS. 5(a), 5(b), and 5(c) are diagrams for use in illustrating the operation of the drying processing unit.

After the elapse of another predetermined time, the rotation speed of the rotation shaft 625 decreases. This reduces the amount of the rinse liquid that is shaken off by the rotation of the substrate W, resulting in the formation of a liquid layer L of the rinse liquid over the entire surface of the substrate W, as shown in FIG. 5(a). Alternatively, the rotation of the rotation shaft 625 may be stopped to form the liquid layer L over the entire surface of the substrate W.

The embodiment employs the configuration in which the nozzle 650 is used for supplying both the cleaning liquid and the rinse liquid, so as to supply both the cleaning liquid and the rinse liquid from the nozzle 650. However, a configuration may also be employed in which nozzles are separately provided for supplying the cleaning liquid and the rinse liquid.

In order to prevent the rinse liquid from flowing to the back surface of the substrate W during the supply of the rinse liquid, pure water may be supplied to the back surface of the substrate W from a back rinsing nozzle (not shown).

Note that when using pure water as the cleaning liquid for cleaning the substrate W, it is not necessary to supply the rinse liquid.

The supply of the rinse liquid is subsequently stopped, and the nozzle 650 retracts to the predetermined position while the nozzle 670 moves above the center of the substrate W. The inert gas is subsequently discharged from the nozzle 670. This causes the rinse liquid around the center of the substrate W to move toward a peripheral portion of the substrate W, leaving the liquid layer L only on the peripheral portion, as shown in FIG. 5(b).

Next, as the number of revolutions of the rotation shaft 625 (see FIG. 4) increases, the nozzle 670 gradually moves from above the center of the substrate W to above the peripheral portion thereof, as shown in FIG. 5(c). This causes a great centrifugal force acting on the liquid layer L on the substrate W while allowing the inert gas to be sprayed toward the entire surface of the substrate W, thereby ensuring the removal of the liquid layer L on the substrate W. As a result, the substrate W can be reliably dried.

Then, the supply of the inert gas is stopped, and the nozzle 670 retracts to the predetermined position while the rotation of the rotation shaft 625 is stopped. After this, the guard 624 is lowered, and the interface transport mechanism IFR in FIG. 1 carries the substrate W out of the drying processing unit DRY. The processing operation of the drying processing unit DRY is thus completed.

It is preferred that the position of the guard 624 during cleaning and drying processings is suitably changed according to the necessity of the recovery or discharge of the processing liquid.

(1-3c) Another Example of Drying Processing Unit

Although the drying processing unit DRY shown in FIG. 4 includes the nozzle 650 for cleaning processing and the nozzle 670 for drying processing separately, the nozzle 650 and the nozzle 670 may also be formed integrally, as shown in FIG. 6. This obviates the need to move each of the nozzle 650 and the nozzle 670 separately during the cleaning or drying processing to the substrate W, thereby simplifying the driving mechanism.

Figure 7:
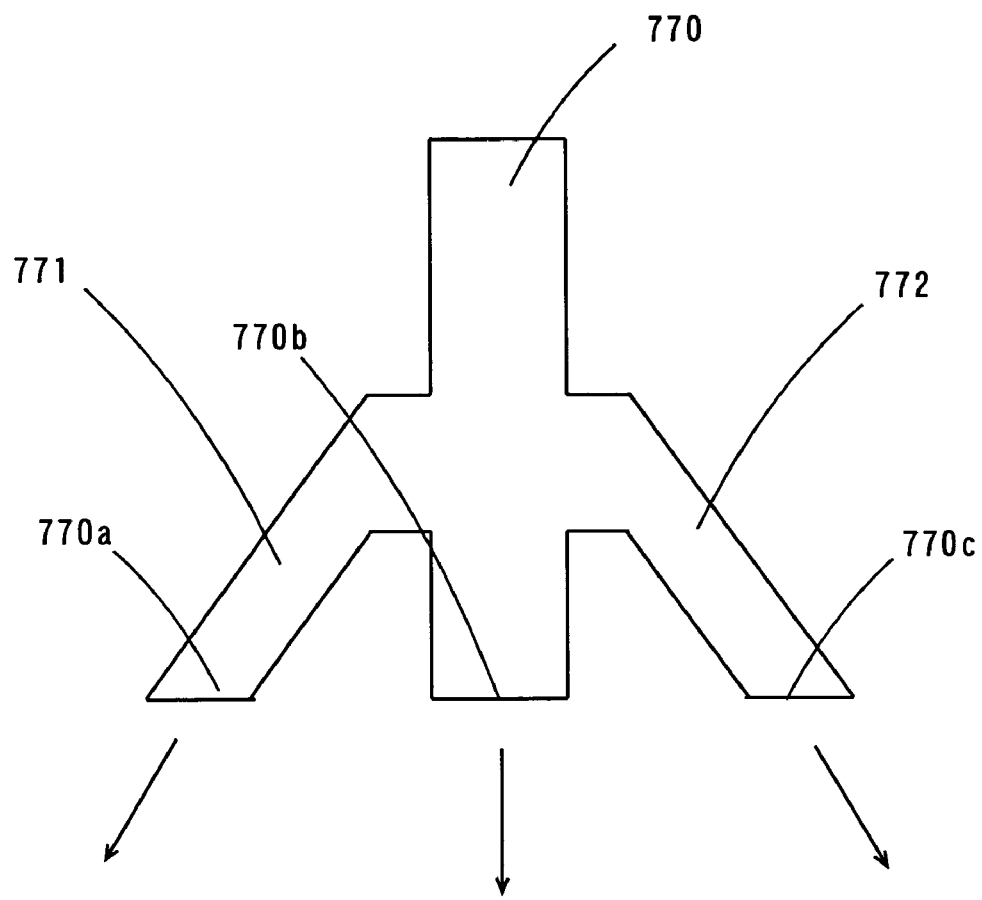
FIG. 7 is a schematic diagram showing another example of the nozzle for drying processing.

A nozzle 770 for drying processing as shown in FIG. 7 may also be used instead of the nozzle 670 for drying processing.

The nozzle 770 in FIG. 7 extends vertically downward, and also has branch pipes 771, 772 that extend obliquely downward from sides thereof. A gas discharge port 770a is formed at the lower end of the branch pipe 771, a gas discharge port 770b is formed at the lower end of the nozzle 770, and a gas discharge port 770c is formed at the lower end of the branch pipe 772, each for discharging an inert gas. The discharge port 770b discharges an inert gas vertically downward, and the discharge ports 770a, 770c each discharge an inert gas obliquely downward, as indicated by the arrows in FIG. 7. That is to say, the nozzle 770 discharges the inert gas so as to increase the spraying area downwardly.

Now, a drying processing unit DRY using the nozzle 770 for drying processing applies drying processing to the substrate W as will now be described.

Figure 8:
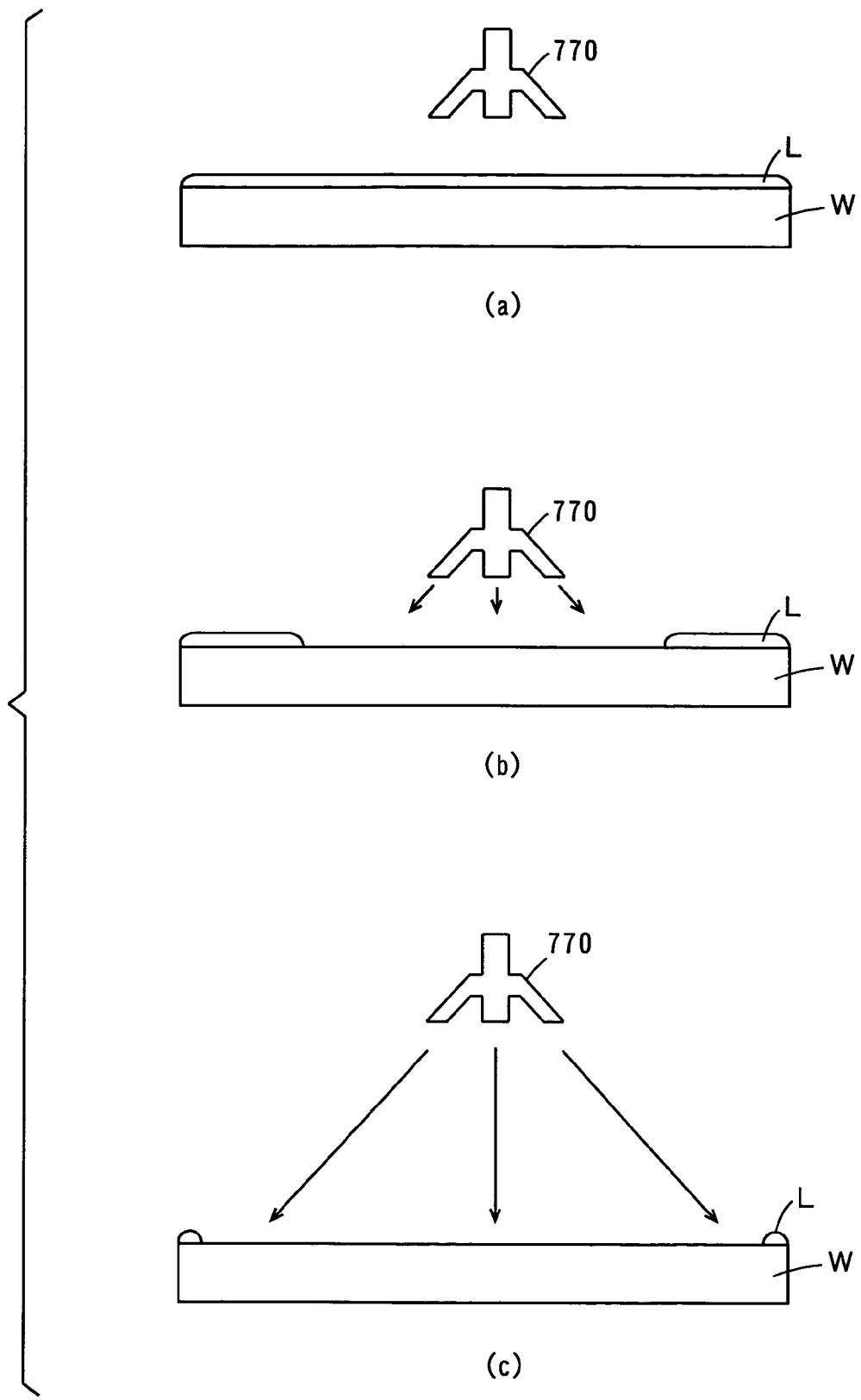
FIGS. 8(a), 8(b), and 8(c) are diagrams for use in illustrating a method of applying drying processing to a substrate using the nozzle in FIG. 7.

FIGS. 8(a), 8(b), 8(c) are diagrams for use in illustrating a method of applying drying processing to the substrate W using the nozzle 770.

Initially, a liquid layer L is formed on the surface of the substrate W by the method as described in FIG. 6, and then the nozzle 770 moves above the center of the substrate W, as shown in FIG. 8(a). After this, an inert gas is discharged from the nozzle 770. This causes the rinse liquid on the center of the substrate W to move to the peripheral portion of the substrate W, leaving the liquid layer L only on the peripheral portion of the substrate W, as shown in FIG. 8(b). At the time, the nozzle 770 is brought close to the surface of the substrate W so as to reliably move the rinse liquid present on the center of the substrate W.

Next, as the number of revolutions of the rotation shaft 625 (see FIG. 4) increases, the nozzle 770 moves upward as shown in FIG. 8(c). This causes a great centrifugal force acting on the liquid layer L on the substrate W while increasing the area to which the inert gas is sprayed on the substrate W. As a result, the liquid layer L on the substrate W is reliably removed. Note that the nozzle 770 can be moved up and down by lifting and lowering the second rotation shaft 672 via a rotation shaft lifting mechanism (not shown) provided to the second rotation shaft 672 in FIG. 4.

Alternatively, a nozzle 870 for drying processing as shown in FIG. 9 may be used instead of the nozzle 770. The nozzle 870 in FIG. 9 has a discharge port 870*a* whose diameter gradually increases downward. This discharge port 870*a* discharges an inert gas vertically downward and obliquely downward as indicated by the arrows in FIG. 9. That is, similarly to the nozzle 770 in FIG. 7, the nozzle 870 discharges the inert gas so as to increase the spraying area downwardly. Consequently, drying processing similar to that using the nozzle 770 can be applied to the substrate W using the nozzle 870.

Figure 10:
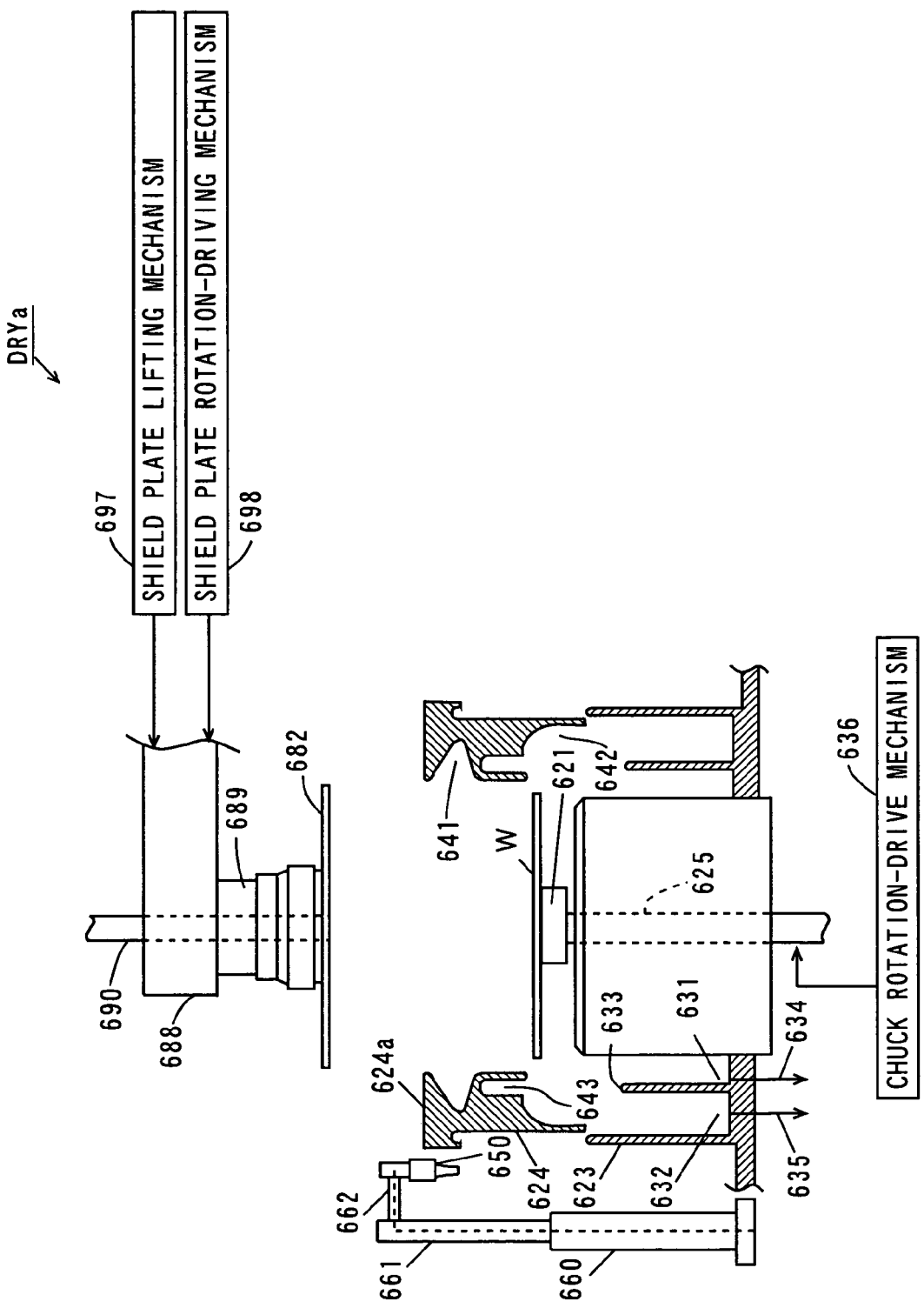
FIG. 10 is a schematic diagram showing another example of the drying processing unit.

A drying processing unit DRYa as shown in FIG. 10 may also be used instead of the drying processing unit DRY shown in FIG. 4.

The drying processing unit DRYa in FIG. 10 is different from the drying processing unit DRY in FIG. 4 as described below.

The drying processing unit DRYa in FIG. 10 includes above the spin chuck 621 a disk-shaped shield plate 682 having an opening through the center thereof. A support shaft 689 extends vertically downward from around an end of an arm 688, and the shield plate 682 is mounted at a lower end of the support shaft 689 so as to oppose the top surface of the substrate W held on the spin chuck 621.

A gas supply passage 690 that communicates with the opening of the shield plate 682 is inserted into the inside of the support shaft 689. A nitrogen gas ($N_2$), for example, is supplied into the gas supply passage 690.

The arm 688 is connected with a shield plate lifting mechanism 697 and a shield plate rotation-driving mechanism 698. The shield plate lifting mechanism 697 lifts and lowers the shield plate 682 between a position close to the top surface of the substrate W held on the spin chuck 621 and a position upwardly away from the spin chuck 621.

Figure 11:
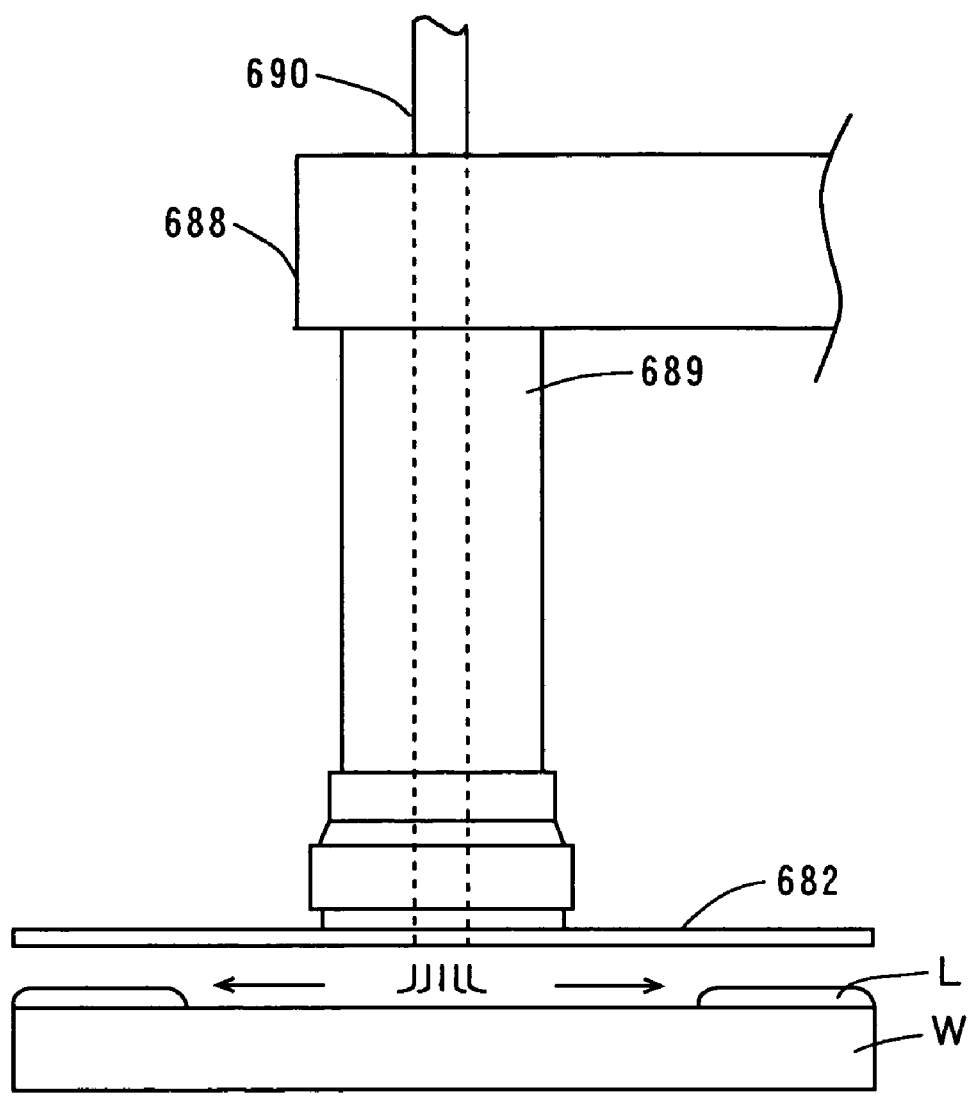
FIG. 11 is a diagram for use in illustrating a method of applying drying processing to the substrate using the drying processing unit in FIG. 10.

During the drying processing to the substrate W in the drying processing unit DRYa in FIG. 10, with the shield plate 628 brought close to the substrate W as shown in FIG. 11, an inert gas is supplied to clearance between the substrate W and the shield plate 682 from the gas supply passage 690. This allows the inert gas to be efficiently supplied from the center of the substrate W to the peripheral portion thereof, thereby ensuring the removal of the liquid layer L on the substrate W.

Although in the above-described embodiment, the substrate W is subjected to drying processing by spin drying in the drying processing unit DRY, the substrate W may be subjected to drying processing by other methods such as a reduced pressure drying method or an air knife drying method.

Although in the above-described embodiment, the inert gas is supplied from the nozzle 670 with the liquid layer L of the rinse liquid being formed, the following method may be applied when the liquid layer L of the rinse liquid is not formed or the rinse liquid is not used. That is, the liquid layer of cleaning liquid is shaken off once by rotating the substrate W, and an inert gas is then immediately supplied from the nozzle 670 to thoroughly dry the substrate W.

(1-3d) Effects of Drying Processing Unit

As described above, in the substrate processing apparatus 500 according to the embodiment, the substrate W is subjected to the drying processing by the drying processing unit DRY after the exposure processing by the exposure device 14. The liquid attached to the substrate W during the exposure processing is thus removed in the drying processing unit. This prevents a liquid from dropping in the substrate processing apparatus 500 as the substrate W is carried from the drying processing unit DRY to the interface block 13, drying/development processing block 12, resist film processing block 11, anti-reflection film processing block 10, and indexer block 9. As a result, the substrate processing apparatus 500 is prevented from operational troubles.

In addition, the drying processing unit DRY applies the drying processing to the substrate W by spraying the inert gas to the substrate W from the center to the peripheral portion thereof while rotating the substrate W. This reliably removes the cleaning liquid and the rinse liquid on the substrate W, so as to reliably prevent particles and the like in the atmosphere from attaching to the cleaned substrate W. This prevents contamination of the substrate W reliably while preventing the generation of dry marks on the surface of the substrate W.

In addition, the cleaning liquid and the rinse liquid are reliably prevented from remaining on the cleaned substrate W, so that the resist components are reliably prevented from eluting in the cleaning liquid and the rinse liquid during the transport of the substrate W from the drying processing unit DRY to the development processing group 90. This prevents the deformation of an exposure pattern formed on the resist film. As a result, the accuracy of line width can be reliably prevented from decreasing during the development processing.

Further, the drying processing unit DRY applies the cleaning processing to the substrate W before the drying processing. Thus, even if a liquid attaches to the substrate during exposure, and particles and the like in the atmosphere adhere to the substrate during the transport of the substrate W from the exposure device 14 to the drying processing unit DRY, the deposits can be reliably removed.

As a result of the foregoing, the substrate W can be reliably prevented from processing defects.

(1-4) Interface Transport Mechanism

Figure 12:
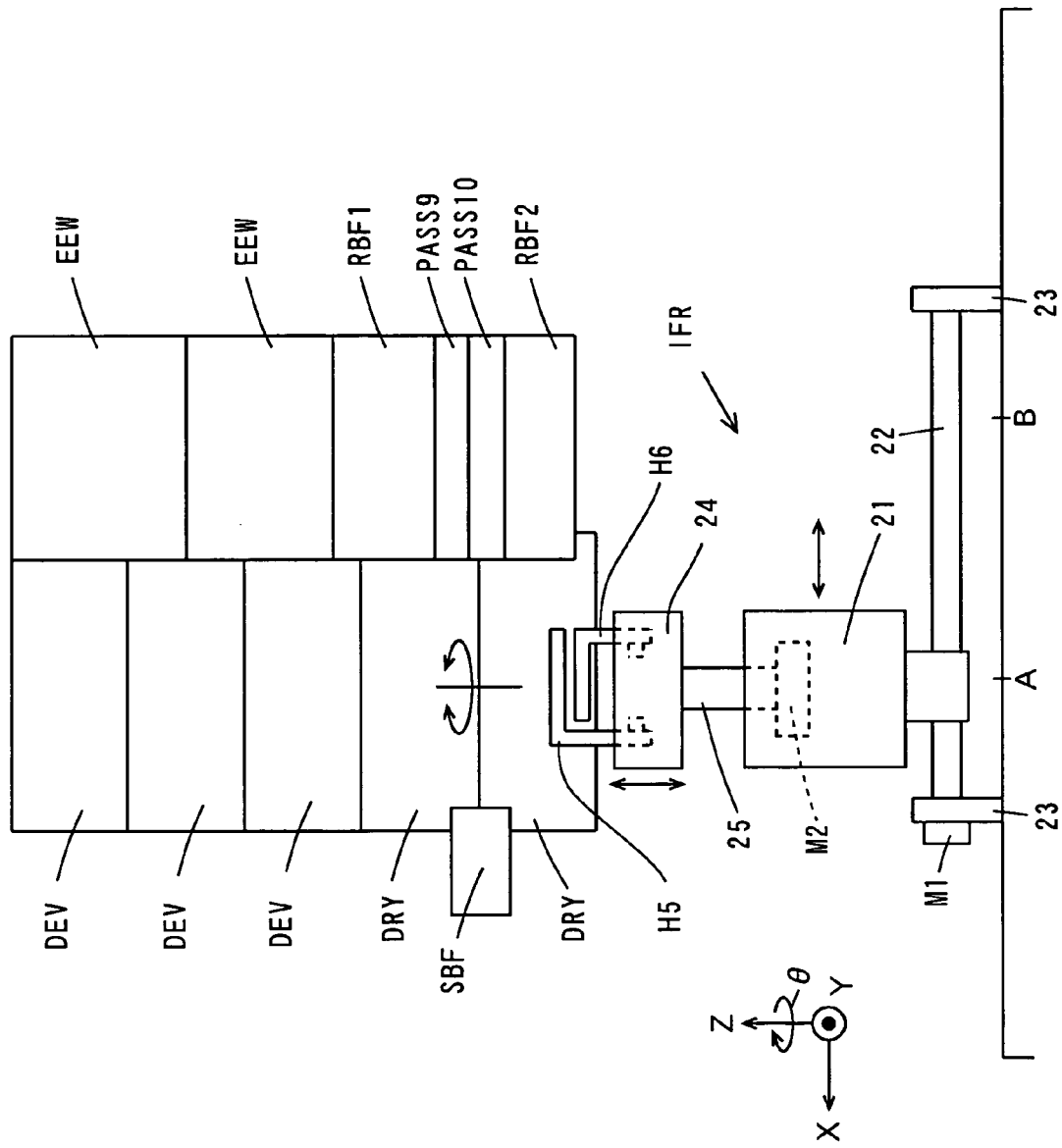
FIG. 12 is a diagram for use in illustrating the configuration and operation of the interface transport mechanism.

The interface transport mechanism IFR is next described. FIG. 12 is a diagram for use in illustrating the configuration and operation of the interface transport mechanism IFR.

(1-4a) Configuration and Operation of Interface Transport Mechanism

The configuration of the interface transport mechanism IFR is first described. As shown in FIG. 12, a movable base 21 in the interface transport mechanism IFR is threadably mounted to a screwed shaft 22. The screwed shaft 22 is rotatably supported with support bases 23 so as to extend in the X direction. One end of the screwed shaft 22 is provided with a motor M1, which causes the screwed shaft 22 to rotate and the movable base 21 to horizontally move in the ±X direction.

A hand support base 24 is mounted on the movable base 21 so as to rotate in the ±θ direction while moving up and down in the ±Z direction. The hand support base 24 is coupled to a motor M2 in the movable base 21 through a rotation shaft 25, and rotated by the motor M2. Two hands H5, H6 for holding the substrate W in a horizontal attitude are mounted to the hand support base 24 one above the other so as to move forward and backward.

The operation of the interface transport mechanism IFR is next described. The operation of the interface transport mechanism IFR is controlled by the main controller 30 in FIG. 1.

The interface transport mechanism IFR initially rotates the hand support base 24 at the position A in FIG. 12 while lifting the hand support base 24 in the +Z direction, to allow the upper hand H5 to enter the substrate platform PASS9. When the hand H5 has received the substrate W in the substrate platform PASS9, the interface transport mechanism IFR retracts the hand H5 from the substrate platform PASS9, and lowers the hand support base 24 in the −Z direction.

The interface transport mechanism IFR subsequently moves in the −X direction, and rotates the hand support base 24 at the position B while allowing the hand H5 to enter a substrate inlet 14a in the exposure device 14 (see FIG. 1). After the hand H5 has carried the substrate W into the substrate inlet 14a, the interface transport mechanism IFR retracts the hand H5 from the substrate inlet 14a.

Then, the interface transport mechanism IFR allows the hand H6 to enter a substrate outlet 14b in the exposure device 14(see FIG. 1). When the hand H6 has received the substrate W after exposure processing from the substrate outlet 14b, the interface transport mechanism IFR retracts the hand H6 from the substrate outlet 14b.

After this, the interface transport mechanism IFR moves in the +X direction, and rotates the hand support base 24 at the position A while lifting the hand support base 24 in the +Z direction, to allow the hand H6 to enter either of the two drying processing units DRY. After the hand 6 has carried the substrate W into a drying processing unit DRY, the interface transport mechanism IFR retracts the hand H6 from the drying processing unit DRY.

Then, the interface transport mechanism IFR lifts or lowers the hand support base 24 in the ±Z direction to allow the hand H5 to enter the other drying processing unit DRY of the two. When the hand H5 has received the substrate W after drying processing from the drying processing unit DRY, the interface transport mechanism IFR retracts the hand H5 from the drying processing unit DRY.

The interface transport mechanism IFR then lifts or lowers the hand support base 24 in the ±Z direction while rotating the hand support base 24, to allow the hand H5 to enter the substrate platform PASS10, and transfer the substrate W therein.

If the exposure device 14 is not capable of receiving the substrate W during the transport of the substrate W from the substrate platform PASS9 to the exposure device 14, the substrate W is temporarily stored in the buffer SBF.

Also, if the drying processing unit DRY is not capable of receiving the substrate W during the transport of the substrate W from the exposure device 14 to the drying processing unit DRY, the substrate W is temporarily stored in the return buffer unit RBF2.

(1-4b) Effects of Interface Transport Mechanism

As described above, in this embodiment, the hand H5 of the interface transport mechanism IFR is used when transporting the substrate W from the substrate platform PASS9 to the exposure device 14 and from the drying processing units DRY to the substrate platform PASS10, while the hand H6 is used when transporting the substrate W from the exposure device 14 to the drying processing units DRY. That is, the hand H6 is used for transporting the substrate W to which a liquid is attached after the exposure processing, while the hand H5 is used for transporting the substrate W to which no liquid is attached before the exposure processing. This prevents the liquid on the substrate W from attaching to the hand H5.

Moreover, since the hand H6 is arranged below the hand H5, even if a liquid drops from the hand H6 and the substrate W held thereon, the liquid will not attach to the hand H5 and the substrate W held thereon.

As a result of the foregoing, the liquid is reliably prevented from attaching to the substrate W after the drying processing, so that the substrate processing apparatus can be more reliably prevented from operational troubles due to drops of liquid in the substrate processing apparatus.

(1-4c) Modifications of First Embodiment

In this embodiment, the substrates W are transported from the substrate platform PASS9 to the exposure device 14, from the exposure device 14 to the drying processing units DRY, and from the drying processing units DRY to the substrate platform PASS10 by the single interface transport mechanism IFR. However, the substrates W may also be carried using a plurality of interface transport mechanisms.

Moreover, the number of the drying processing units DRY is not limited to two, and the number may suitably be changed according to the processing speed of each processing block.

In addition, the operation and configuration of the interface transport mechanism IFR may be modified according to the positions of the substrate inlet 14a and the substrate outlet 14b in the exposure device 14. For example, when the substrate inlet 14a and the substrate outlet 14b in the exposure device 14 are positioned opposite to the drying processing group 95, the screwed shaft 22 in FIG. 12 may be omitted.

(2) Second Embodiment (2-1) Drying Processing Unit Using Two-Fluid Nozzle

A substrate processing apparatus according to a second embodiment is different from the substrate processing apparatus according to the first embodiment in using a two-fluid nozzle shown in FIG. 13 in the drying processing unit DRY, instead of the nozzle 650 for cleaning processing and the nozzle 670 for drying processing in FIG. 4. The configuration of the substrate processing apparatus according to the second embodiment is otherwise similar to that of the substrate processing apparatus according to the first embodiment.

FIG. 13 is a longitudinal cross section showing an example of the internal structure of the two-fluid nozzle 950 for use in cleaning and drying processings. The two-fluid nozzle 950 is capable of selectively discharging a gas, a liquid, and a fluid mixture of the gas and liquid.

The two-fluid nozzle 950 in this embodiment is so-called an external-mix type. The external-mix type two-fluid nozzle 950 shown in FIG. 13 comprises an inner body portion 311 and an outer body portion 312. The inner body portion 311 is composed of, e.g., quartz, and the outer body portion 312 is composed of a fluororesin such as PTFE (polytetrafluoroethylene).

A liquid passage 311b is formed along the central axis of the inner body portion 311. The liquid passage 311b is provided with the supply pipe 663 shown in FIG. 4 for cleaning processing. Cleaning liquid or rinse liquid supplied from the supply pipe 663 is thus introduced into the liquid passage 311b.

A liquid discharge port 311a that communicates with the liquid passage 311b is formed at a lower end of the inner body portion 311. The inner body portion 311 is inserted into the outer body portion 312. Upper ends of the inner body portion 311 and the outer body portion 312 are joined together, while lower ends thereof are not joined.

A cylindrical gas passage 312b is formed between the inner body portion 311 and the outer body portion 312. A gas discharge port 312a that communicates with the gas passage 312b is formed at the lower end of the outer body portion 312. The supply pipe 674 shown in FIG. 4 for drying processing is mounted to a peripheral wall of the outer body portion 312, so as to communicate with the gas passage 312b. An inert gas supplied from the supply pipe 674 is thus introduced into the gas passage 312b.

The diameter of the gas passage 312 decreases downward in the vicinity of the gas discharge port 312a. As a result, the velocity of flow of the inert gas is accelerated, and the inert gas is discharged from the gas discharge port 312a.

The cleaning liquid discharged from the liquid discharge port 311a and the inert gas discharged from the gas discharge port 312a are mixed outside near the lower end of the two-fluid nozzle 950 to generate a mist-like fluid mixture that contains fine droplets of the cleaning liquid.

Figure 14:
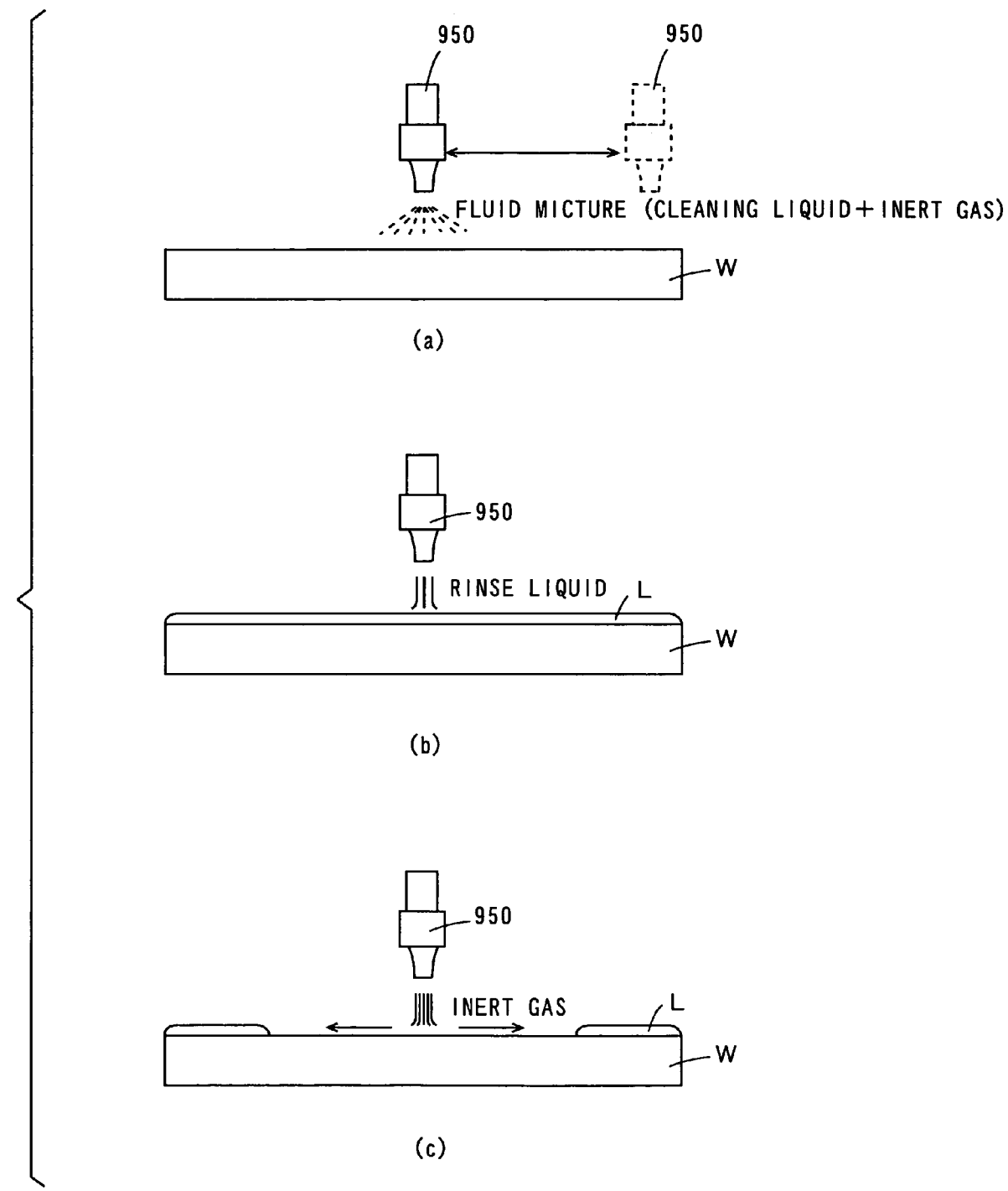
FIGS. 14(a), 14(b), and 14(c) are diagrams for use in illustrating a method of applying drying processing to the substrate using the two-fluid nozzle in FIG. 13.

FIGS. 14(a), 14(b), 14(c) are diagrams for use in illustrating a method of applying drying processing to the substrate W using the two-fluid nozzle 950 in FIG. 13.

The substrate W is initially held on the spin chuck 621 by suction, as shown in FIG. 4, and rotates together with the rotation of the rotation shaft 625. The rotation speed of the rotation shaft 625 is, e.g., about 500 rpm.

In this state, as shown in FIG. 14(a), the two-fluid nozzle 950 discharges the mist-like fluid mixture of the cleaning liquid and the inert gas onto the top surface of the substrate W while gradually moving from above the center of the substrate W to above the peripheral portion thereof. In this way, the fluid mixture is sprayed onto the entire surface of the substrate W from the two-fluid nozzle 950 to clean the substrate W.

Since the fluid mixture discharged from the two-fluid nozzle 950 contains fine droplets of the cleaning liquid, any contaminants attached on the surface of the substrate W can be stripped off, even if the surface has irregularities. The contaminants on the surface of the substrate W can thus be reliably removed. Moreover, even if the films on the substrate W have low wettability, the fine droplets of the cleaning liquid strip off the contaminants on the surface of the substrate W, so that the contaminants can be reliably removed from the surface of the substrate W.

In addition, adjusting the flow rate of the inert gas allows adjustments to be easily made to the detergency in cleaning the substrate W. Thus, when the organic films (i.e., a resist film and a resist cover film) on the substrate W are prone to damage, damage to the organic films on the substrate W can be prevented by weakening the detergency. Tough contaminants on the surface of the substrate W can also be removed reliably by strengthening the detergency. By adjusting the detergency in this way according to the properties of the organic films on the substrate W and the degree of contamination, it is possible to prevent damage to the organic films on the substrate W while cleaning the substrate W reliably.

Next, the supply of the fluid mixture is stopped, and the rotation speed of the rotation shaft 625 decreases while the rinse liquid is discharged from the two-fluid nozzle 960 onto the substrate W, as shown in FIG. 14(b). The rotation speed of the rotation shaft 625 is, e.g., about 10 rpm. A liquid layer L of the rinse liquid is thus formed on the entire surface of the substrate W. Alternatively, the rotation of the rotation shaft 625 may be stopped to form the liquid layer L on the entire surface of the substrate W. When pure water is used as the cleaning liquid in the fluid mixture for cleaning the substrate W, the supply of the rinse liquid may be omitted.

After the formation of the liquid layer L, the supply of the rinse liquid is stopped. Then, the inert gas is discharged onto the substrate W from the two-fluid nozzle 950, as shown in FIG. 14(c). This causes the cleaning liquid on the center of the substrate W to move to the peripheral portion of the substrate W, leaving the liquid layer L only on the peripheral portion.

Then, the rotation speed of the rotation shaft 625 increases. The rotation speed of the rotation shaft 625 is, e.g., about 100 rpm. This causes a great centrifugal force acting on the liquid layer L on the substrate W, allowing the removal of the liquid layer L on the substrate W. As a result, the substrate W is dried.

The two-fluid nozzle 950 may gradually move from above the center of the substrate W to above the peripheral portion thereof when removing the liquid layer L on the substrate W. This allows the inert gas to be sprayed to the entire surface of the substrate W, which ensures the removal of the liquid layer L on the substrate W. As a result, the substrate W can be reliably dried.

(2-2) Other Example of Drying Processing Unit Using Two-Fluid Nozzle

Although the two-fluid nozzle 950 in FIG. 13 is used to supply the rinse liquid to the substrate W, a separate nozzle may also be used for supplying the rinse liquid to the substrate W.

Moreover, although the two-fluid nozzle 950 in FIG. 13 is used to supply the inert gas to the substrate W when removing the liquid layer L on the substrate W, a separate nozzle may also be used for supplying the inert gas to the substrate W.

(2-3) Effects of Second Embodiment

In the substrate processing apparatus 500 according to the second embodiment, the drying processing unit DRY applies the cleaning processing to the substrate W after the exposure processing by the exposure device 14. In this case, the residual droplets attached on the substrate W after the exposure processing, the eluate from the organic films on the substrate, and the like are removed by supplying the fluid mixture of the cleaning liquid and the inert gas from the two-fluid nozzle 950 in the drying processing unit DRY.

Since the fluid mixture discharged from the two-fluid nozzle 950 contains fine droplets of the cleaning liquid, the contaminants attached on the surface of the substrate W is removed by the fine droplets of the cleaning liquid, even if the surface of the substrate W has irregularities. The contaminants on the surface of the substrate W is thus reliably removed. Moreover, even if the films on the substrate W have low wettability, the fine droplets of the cleaning liquid remove the contaminants on the surface of the substrate W, so that the contaminants can be reliably removed from the surface of the substrate W. As a result of the foregoing, the substrate can be prevented from processing defects due to the contamination after the exposure processing.

In addition, adjusting the flow rate of the inert gas allows adjustments to be easily made to the detergency in cleaning the substrate W. Accordingly, when the organic films on the substrate (i.e., resist film and resist cover film) are prone to damage, damage to the organic films on the substrate W can be prevented by weakening the detergency. Tough contaminants on the surface of the substrate W can also be removed reliably by strengthening the detergency. By adjusting the detergency in this way according to the properties of the organic films on the substrate W and the degree of contamination, it is possible to prevent damage to the organic films on the substrate W while cleaning the substrate W reliably.

Moreover, the drying processing unit DRY applies the drying processing to the substrate W after the cleaning processing. This removes the cleaning liquid supplied onto the substrate W, thus preventing the cleaning liquid from dropping in the substrate processing apparatus 500 as the substrate W is carried from the drying processing unit DRY to the interface block 13, drying/development processing block 12, resist film processing block 11, anti-reflection film processing block 10, and indexer block 9. As a result, the substrate processing apparatus 500 is prevented from operational troubles.

Furthermore, the drying processing unit DRY applies the drying processing to the substrate W by spraying the inert gas to the substrate W from the center to the peripheral portion thereof while rotating the substrate W. This reliably removes the cleaning liquid and the rinse liquid on the substrate W, so as to prevent particles and the like in the atmosphere from attaching to the cleaned substrate W. This prevents contamination of the substrate W reliably while preventing the generation of dry marks on the surface of the substrate W.

Furthermore, the cleaning liquid and the rinse liquid are reliably prevented from remaining on the cleaned substrate W, so that the resist components are reliably prevented from eluting in the cleaning liquid and the rinse liquid during the transport of the substrate W from the drying processing unit DRY to the development processing group 90. This prevents the deformation of an exposure pattern formed on the resist film. As a result, the accuracy of line width can be reliably prevented from decreasing during the development processing.

As a result of the foregoing, the substrate W can be reliably prevented from processing defects.

In the second embodiment, the external-mix type two-fluid nozzle 950 is used. This external-mix type two-fluid nozzle 950 generates the fluid mixture by mixing the cleaning liquid and the inert gas outside the two-fluid nozzle 950. The inert gas and the cleaning liquid flow through the separate flow passages, respectively, in the two-fluid nozzle 950. This prevents the cleaning liquid from remaining in the gas passage 312b, allowing the inert gas to be discharged independently from the two-fluid nozzle 950. Also, the rinse liquid can be discharged independently from the two-fluid nozzle 950 by supplying the rinse liquid from the supply pipe 663. This allows the fluid mixture, the inert gas, and the rinse liquid to be selectively discharged from the two-fluid nozzle 950.

Furthermore, the use of the two-fluid nozzle 950 obviates the need to provide nozzles for supplying the cleaning liquid or the rinse liquid to the substrate W and for supplying the inert gas to the substrate W separately. This provides reliable cleaning and drying of the substrate W with a simple structure.

(3) Correspondence Between Each Claim Element and Each Component In Embodiments

In the embodiments, each of the anti-reflection film processing block 10, the resist film processing block 11, and the drying/development processing block 12 corresponds to a processing section; the interface block 13 corresponds to an interface; each of the drying processing units DRY, DRYa corresponds to a first processing unit; each of the edge exposure units EEW corresponds to a second processing unit; each of the coating units RES corresponds to a third processing unit; each of the substrate platforms PASS9, PASS10 corresponds to a platform; the fourth central robot CR4 corresponds to a first transport unit; and the interface transport mechanism IFR corresponds to a second transport unit.

The hand H5 corresponds to a first holder; the hand H6 corresponds to a second holder; each of the coating units BARC, RES, and the development processing units DEV corresponds to a chemical solution processing unit; and each of the thermal processing units PHP, the hot plates HP, and the cooling plates CR corresponds to a thermal processing unit.

The spin chuck 621 corresponds to a substrate holding device; the rotation shaft 625 and the chuck rotation-drive mechanism 636 correspond to a rotation-driving device; the nozzle 650 for cleaning processing corresponds to a cleaning liquid supplier and a rinse liquid supplier; and each of the nozzles 670, 770, 870 for drying processing corresponds to an inert gas supplier.

The two-fluid nozzle 950 corresponds to a fluid nozzle; the liquid passage 311b corresponds to a liquid flow passage; and the gas passage 312b corresponds to a gas flow passage.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A substrate processing apparatus that is arranged adjacent to an exposure device, comprising:
a processing section for applying processing to a substrate; and
an interface for exchanging the substrate between said processing section and said exposure device, wherein
said processing section includes a first processing unit that dries the substrate,
said interface includes a transport device that transports the substrate between said processing section and said exposure device, and
said transport device transports the substrate that has been carried out of said exposure device to said first processing unit.

2. The substrate processing apparatus according to claim 1, wherein
said first processing unit dries the substrate by supplying an inert gas onto the substrate.

3. The substrate processing apparatus according to claim 1, wherein
said interface further includes a second processing unit that applies given processing to the substrate and a platform on which the substrate is temporarily mounted, and
said transport device includes:
a first transport unit that transports the substrate between said processing section, said second processing unit, and said platform; and
a second transport unit that transports the substrate between said platform, said exposure device, and said first processing unit, and wherein
said second transport unit transports the substrate that has been carried out of said exposure device to said first processing unit.

4. The substrate processing apparatus according to claim 3, wherein
said second transport unit comprises a first holder and a second holder each for holding the substrate,
said second transport unit holds the substrate with said first holder when transporting the substrate from said platform to said exposure device and from said first processing unit to said platform, and
said second transport unit holds the substrate with said second holder when transporting the substrate from said exposure device to said first processing unit.

5. The substrate processing apparatus according to claim 4, wherein
said second holder is provided below said first holder.

6. The substrate processing apparatus according to claim 3, wherein
said second processing unit includes an edge exposure unit for subjecting a peripheral portion of the substrate to exposure.

7. The substrate processing apparatus according to claim 1, wherein said processing section further includes a third processing unit that forms a photosensitive film made of a photosensitive material on the substrate before exposure processing by said exposure device.

8. The substrate processing apparatus according to claim 1, wherein
said first processing unit further cleans the substrate before drying the substrate.

9. The substrate processing apparatus according to claim 8, wherein
said first processing unit comprises:
a substrate holding device that holds the substrate substantially horizontally;
a rotation-driving device that rotates the substrate held on said substrate holding device about an axis vertical to the substrate;
a cleaning liquid supplier that supplies a cleaning liquid onto the substrate held on said substrate holding device; and
an inert gas supplier that supplies an inert gas onto the substrate after the cleaning liquid has been supplied onto the substrate by said cleaning liquid supplier.

10. The substrate processing apparatus according to claim 9, wherein
said inert gas supplier supplies the inert gas so that the cleaning liquid supplied onto the substrate from said cleaning liquid supplier is removed from the substrate as the cleaning liquid moves outwardly from the center of the substrate.

11. The substrate processing apparatus according to claim 9, wherein
said first processing unit further comprises a rinse liquid supplier that supplies a rinse liquid onto the substrate after the supply of the cleaning liquid from said cleaning liquid supplier and before the supply of the inert gas from said inert gas supplier.

12. The substrate processing apparatus according to claim 11, wherein
said inert gas supplier supplies the inert gas so that the rinse liquid supplied onto the substrate from said rinse liquid supplier is removed from the substrate as the rinse liquid moves outwardly from the center of the substrate.

13. The substrate processing apparatus according to claim 1, wherein
said processing section includes a chemical solution processing unit that treats the substrate with a chemical solution, and a thermal processing unit that thermally treats the substrate.

14. A substrate processing method for processing a substrate in a substrate processing apparatus that is arranged adjacent to an exposure device and comprises a processing section, a transport device, and a first processing unit, comprising the steps of:
applying given processing to the substrate by said processing section;
transporting the substrate that has been processed by said processing section to said exposure device by means of said transport device;
transporting the substrate that has been carried out of said exposure device to said first processing unit by means of said transport device;
drying the substrate by said first processing unit; and
transporting the substrate that has been dried by said first processing unit to said processing section by means of said transport device.

15. The substrate processing method according to claim 14, further comprising the step of cleaning the substrate by said first processing unit, after said step of transporting the substrate to said first processing unit by means of said transport device and before said step of drying the substrate by said first processing unit.

16. A substrate processing apparatus that is arranged adjacent to an exposure device, comprising:
a processing section for applying processing to a substrate; and
an interface for exchanging the substrate between said processing section and said exposure device, wherein
said processing section includes a first processing unit that cleans the substrate with a fluid nozzle that supplies a fluid mixture containing a liquid and a gas onto the substrate,
said interface includes a transport device that transports the substrate between said processing section and said exposure device, and
said transport device transports the substrate that has been carried out of said exposure device to said first processing unit.

17. The substrate processing apparatus according to claim 16, wherein
said first processing unit applies cleaning processing to the substrate by supplying a fluid mixture containing an inert gas and a cleaning liquid onto the substrate from said fluid nozzle.

18. The substrate processing apparatus according to claim 16, wherein
said first processing unit applies drying processing to the substrate after said cleaning processing to the substrate.

19. The substrate processing apparatus according to claim 18, wherein
said first processing unit includes an inert gas supplier that applies drying processing to the substrate by supplying an inert gas onto the substrate.

20. The substrate processing apparatus according to claim 19, wherein
said fluid nozzle functions as said inert gas supplier.

21. The substrate processing apparatus according to claim 19, wherein
said first processing unit further includes:
a substrate holding device that holds the substrate substantially horizontally; and
a rotation-driving device that rotates the substrate held on said substrate holding device about an axis vertical to the substrate.

22. The substrate processing apparatus according to claim 19, wherein
said first processing unit supplies the inert gas so that the fluid mixture supplied onto the substrate from said fluid nozzle is removed from the substrate as the fluid mixture moves outwardly from the center of the substrate.

23. The substrate processing apparatus according to claim 19, wherein
said first processing unit further includes a rinse liquid supplier that supplies a rinse liquid onto the substrate, after the supply of the fluid mixture from said fluid nozzle and before the supply of the inert gas from said inert gas supplier.

24. The substrate processing apparatus according to claim 23, wherein
said fluid nozzle functions as said rinse liquid supplier.

25. The substrate processing apparatus according to claim 23, wherein
said first processing unit supplies the inert gas so that the rinse liquid supplied onto the substrate from said rinse liquid supplier is removed from the substrate as the rinse liquid moves outwardly from the center of the substrate.

26. The substrate processing apparatus according to claim 16, wherein
said fluid nozzle has a liquid flow passage through which a liquid flows, a gas flow passage through which a gas flows, a liquid discharge port having an opening that communicates with said liquid flow passage, and a gas discharge port that is provided near said liquid discharge port and having an opening that communicates with said gas flow passage.

27. A substrate processing method for processing a substrate in a substrate processing apparatus that is arranged adjacent to an exposure device and comprises a processing section, a transport device, and a first processing unit, comprising the steps of:
applying given processing to a substrate by said processing section;
transporting the substrate that has been processed by said processing section to said exposure device by means of said transport device;
transporting the substrate that has been carried out of said exposure device to said first processing unit by means of said transport device;
cleaning the substrate with a fluid nozzle that supplies a fluid mixture containing a liquid and a gas onto the substrate in said first processing unit; and
transporting the substrate that has been cleaned by said first processing unit to said processing section by means of said transport device.

28. The substrate processing method according to claim 27, further comprising the step of drying the substrate by said first processing unit, after said step of cleaning the substrate by said first processing unit and before said step of transporting the substrate that has been cleaned by said first processing unit to said processing section by means of said transport device.

* * * * *